United States Patent
Shim et al.

(10) Patent No.: US 9,916,093 B2
(45) Date of Patent: Mar. 13, 2018

(54) NONVOLATILE MEMORY DEVICE AND STORAGE DEVICE FOR STORING BAD BLOCK MANAGEMENT INFORMATION WITH HIGH RELIABILITY

(71) Applicant: SAMSUNG ELECTRONICS CO., LTD., Suwon-si (KR)

(72) Inventors: Min-Soo Shim, Asan-si (KR); Jinsung Jung, Asan-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/207,591

(22) Filed: Jul. 12, 2016

(65) Prior Publication Data
US 2017/0024139 A1 Jan. 26, 2017

(30) Foreign Application Priority Data
Jul. 22, 2015 (KR) .................. 10-2015-0103608

(51) Int. Cl.
*G11C 11/34* (2006.01)
*G06F 3/06* (2006.01)

(52) U.S. Cl.
CPC ............ *G06F 3/0604* (2013.01); *G06F 3/064* (2013.01); *G06F 3/0619* (2013.01); *G06F 3/0656* (2013.01); *G06F 3/0659* (2013.01); *G06F 3/0665* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 6,885,956 B2 | 4/2005 | Baba | |
| 7,191,306 B2 | 3/2007 | Myoung et al. | |
| 7,679,133 B2 | 3/2010 | Son et al. | |
| 7,916,540 B2 | 3/2011 | Byeon | |
| 8,285,919 B2 | 10/2012 | Luo et al. | |
| 8,289,770 B2 | 10/2012 | Lee et al. | |
| 8,312,245 B2 | 11/2012 | Asnaashari et al. | |
| 8,407,437 B1 * | 3/2013 | Cheng ................. | G06F 11/108 711/103 |
| 8,539,315 B2 | 9/2013 | Hashimoto | |

(Continued)

FOREIGN PATENT DOCUMENTS

| | | |
|---|---|---|
| JP | 2004-145964 A | 5/2004 |
| JP | 2014-182690 A | 9/2014 |
| KR | 10-0936533 B1 | 1/2010 |

*Primary Examiner* — Harry W Byrne
*Assistant Examiner* — Sultana Begum
(74) *Attorney, Agent, or Firm* — Sughrue Mion, PLLC

(57) ABSTRACT

A nonvolatile memory device is provided. The nonvolatile memory device includes a memory cell array comprising a first area that stores memory management information and a second area that stores user data, a decoder configured to select at least one of rows of the first area or the second area based on an address, a page buffer configured to store data in memory cells connected to the selected at least one row or to detect data stored in the memory cells, and control logic configured to control the decoder and the page buffer in response to a specific command, to access the first area. The memory management information is iteratively programmed by a specific memory unit and is written at different columns of specific memory units.

12 Claims, 21 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 2004/0078700 A1 | 4/2004 | Jeong |
| 2004/0085849 A1 | 5/2004 | Myoung et al. |
| 2004/0148119 A1 | 7/2004 | Baba |
| 2006/0224841 A1* | 10/2006 | Terai .................... G06F 9/4403 711/154 |
| 2008/0285347 A1 | 11/2008 | Byeon |
| 2009/0013148 A1 | 1/2009 | Eggleston |
| 2009/0121271 A1 | 5/2009 | Son et al. |
| 2010/0067312 A1 | 3/2010 | Lee et al. |
| 2010/0122022 A1 | 5/2010 | Luo et al. |
| 2011/0216603 A1 | 9/2011 | Han et al. |
| 2011/0233648 A1 | 9/2011 | Seol et al. |
| 2012/0051143 A1 | 3/2012 | Yoon et al. |
| 2012/0124304 A1 | 5/2012 | Asnaashari et al. |
| 2013/0159814 A1 | 6/2013 | Hashimoto |
| 2013/0279262 A1 | 10/2013 | Yoon et al. |
| 2014/0369124 A1* | 12/2014 | Moon ..................... G11C 16/16 365/185.11 |
| 2015/0131379 A1 | 5/2015 | Oh |
| 2016/0202910 A1* | 7/2016 | Ravimohan ............. G06F 3/061 711/103 |

\* cited by examiner

FIG. 5

| | Y0 | Y1 | Y2 | Y3 | Y4 | Y5 | Y6 | Y7 | Y8 | Y9 | Y10 | Y11 | Y12 | Y13 | Y14 | Y15 |
|---|---|---|---|---|---|---|---|---|---|---|---|---|---|---|---|---|
| R0 | a | b | c | d | e | f | g | h | | | | | | | | |
| R1 | | a | b | c | d | e | f | g | h | | | | | | | |
| R2 | | | a | b | c | d | e | f | g | h | | | | | | |
| R3 | | | | a | b | c | d | e | f | g | h | | | | | |
| R4 | | | | | a | b | c | d | e | f | g | h | | | | |
| R5 | | | | | | a | b | c | d | e | f | g | h | | | |
| R6 | | | | | | | a | b | c | d | e | f | g | h | | |
| R7 | | | | | | | | a | b | c | d | e | f | g | h | |

NONVOLATILE MEMORY DEVICE AND STORAGE DEVICE FOR STORING BAD BLOCK MANAGEMENT INFORMATION WITH HIGH RELIABILITY

CROSS-REFERENCE TO RELATED APPLICATIONS

The present application claims priority from Korean Patent Application No. 10-2015-0103608 filed Jul. 22, 2015, in the Korean Intellectual Property Office, the entire contents of which are hereby incorporated by reference.

BACKGROUND

1. Field

Apparatuses and methods consistent with exemplary embodiments of the inventive concept relate to a semiconductor memory device, and in particular, to a nonvolatile memory device and a method for managing memory management information thereof.

2. Related Art

A semiconductor memory device is generally divided into a volatile semiconductor memory device and a nonvolatile semiconductor memory device. The volatile semiconductor memory device loses data stored therein at power-off. In contrast, the nonvolatile semiconductor memory device retains data stored therein even at power-off. Accordingly, the nonvolatile semiconductor memory device is used to store contents to be retained regardless of whether power is supplied.

A typical example of the nonvolatile memory device is a flash memory device. The flash memory device is widely used as a voice and image data storage medium of information devices such as a computer, a portable phone, a digital camera, a camcorder, a voice recorder, an MP3 player, a personal digital assistant (PDA), a handheld PC, a game machine, a facsimile, a scanner, a printer, and the like (hereinafter referred to as "host").

Various flash memory-based storage devices are being released. Storage devices such as a solid state drive (SSD) for replacing a hard disk drive (HDD), a flash-based embedded multimedia card, a multimedia card (MMC), and the like are being widely used. The flash memory device is used as the most basic storage media of such storage devices.

A nonvolatile memory device having three-dimensionally stacked memory cells is being used to improve the degree of integration of the flash memory device. However, the defect of a column direction which frequently arises from a three-dimensional memory may cause a decrease in reliability of control information written in a specific area of the flash memory device. For example, the control information is management information about bad blocks accumulated in producing and testing the flash memory device. If an error arises from such control information, a flash memory device corresponding thereto may be treated as being defective. Accordingly, it is necessary to reduce such defects to improve the yield.

SUMMARY

Exemplary embodiments of the inventive concept provide a nonvolatile memory device which provides memory management information or bad block management information with high reliability, a storage device including the same, and a memory management information managing method thereof.

According to an aspect of an exemplary embodiment, a nonvolatile memory device is provided. The nonvolatile memory device may include a memory cell array comprising a first area in which memory management information is stored and a second area in which user data is stored, a decoder configured to select at least one of rows of the first area or the second area in response to an address, a page buffer configured to store data in memory cells connected to the selected row or to sense data stored in the memory cells, and control logic configured to control the decoder and the page buffer in response to a specific command, to access the first area. The memory management information may be iteratively programmed by a specific memory unit and is written at different column columns of specific memory units different from each other.

According to an aspect of an exemplary embodiment, a storage device is provided. The storage device may include a nonvolatile memory device comprising memory management information iteratively programmed at different column locations of a plurality of memory units, and a memory controller configured to access the nonvolatile memory device using a specific command for reading the memory management information. The memory controller recovers the memory management information by rearranging column locations of memory management information read from the memory units and applying a majority decision algorithm to the rearranged columns.

According to an aspect of an exemplary embodiment, a method for storing memory management information in a nonvolatile memory device is provided. The method may include programming the memory management information at a first page area, and programming the memory management information at a second page area. A column location of the memory management information associated with the first area may be different from a column location of the memory management information associated with the second area.

According to an aspect of an exemplary embodiment, a method for reading memory management information from a nonvolatile memory device is provided. The method may include reading a first page area, in which the memory management information is stored, from the nonvolatile memory device, reading a second page area, in which the memory management information is stored, from the nonvolatile memory device, the memory management information being respectively located at different column locations of the first and second page areas, rearranging a column location of first page data read from the first page area and a column location of second page data read from the second page area, and extracting the memory management information by applying a majority decision algorithm to the rearranged first page data and the rearranged second page data.

According to an aspect of an exemplary embodiment, a method for programming bad block management information (BBMI) in a nonvolatile memory device is provided. The method may include programming the BBMI at a first page area by a command, applying a shift value to a column offset corresponding to the first page to shift the BBMI, and programming the BBMI at a second page area using the column offset to which the shift value is applied.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 5 is a diagram schematically illustrating a pattern in which bad block management information according to an exemplary embodiment is programmed;

FIGS. 13A to 13D are diagrams schematically illustrating various examples in which bad block management information of the inventive concept is programmed at a first area of a nonvolatile memory device;

DETAILED DESCRIPTION

Figure 1:
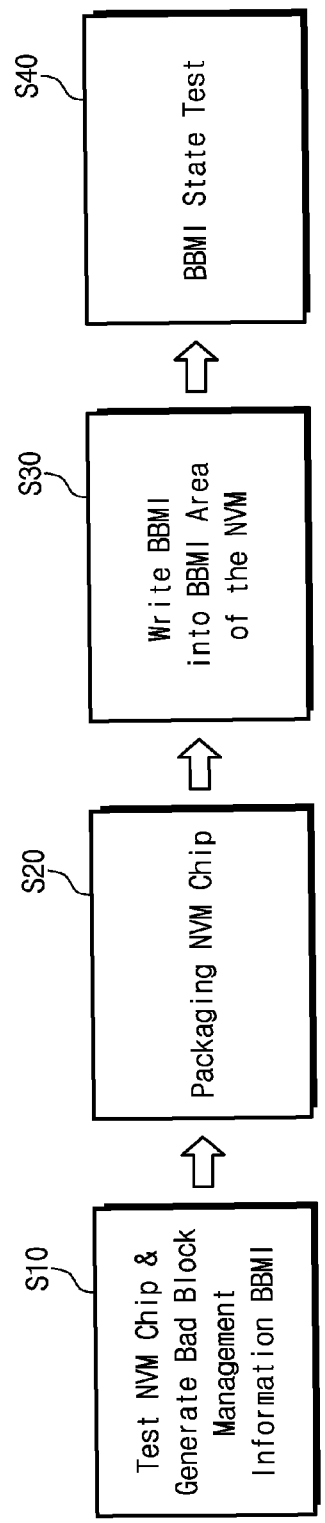
FIG. 1 illustrates the procedure for storing bad block management information of a nonvolatile memory device in the nonvolatile memory device, according to an exemplary embodiment.

It should be understood that a general description and the following detailed description all are exemplary, and it should be viewed as an additional description about claims that are provided. The same reference numerals or the same reference designators denote the same elements throughout the specification. The inventive concept may be implemented or applied through other exemplary embodiments. In addition, the following detailed description may be variously modified or changed based on the application without departing from the spirit and scope of the inventive concept.

Bad block management information (BBMI) to be described below may be memory management information which is stored in a unique memory area of a nonvolatile memory device. Even though the term "bad block management information" (BBMI) is used for descriptive convenience, the bad block management information may be identically applied to memory management information without limitation.

FIG. 1 illustrates the procedure for storing bad block management information of a nonvolatile memory device in the nonvolatile memory device, according to an exemplary embodiment. Referring to FIG. 1, the bad block management information BBMI may be extracted and integrated in various test steps and may be then programmed in a specific area of a nonvolatile memory device. This will be described in more detail described below.

In operation S10, the nonvolatile memory device may experience various test processes at a die state of a wafer level or a chip level. For example, the nonvolatile memory device of a chip or wafer die state may go through various test processes, such as routing test, burn-in test, and the like, using a test pad. Furthermore, whether cells where data of the nonvolatile memory device is stored are defective may be tested. Whether an error exists or whether the defect of a column direction exists may be tested in a process where test data is written and read. Furthermore, data storage performance may be tested by the block. In the test process, a memory block which is inappropriate to store data may be determined as a bad block. Information about the number of bad blocks or locations (or addresses) thereof may be accumulated through various tests, and the accumulated results may be integrated into bad block management information BBMI.

In operation S20, an overall test procedure about the nonvolatile memory device of a chip die state may be completed, and the nonvolatile memory device may go through a package process. A plurality of chips may be arranged or stacked in one package.

In operation S30, writing of bad block management information BBMI about packaged nonvolatile memory devices may be performed. As well as the bad block management information BBMI, a variety of memory management information may be written in a specific area in the process. However, the bad block management information BBMI may be exemplified to describe advantages of the inventive concept. The bad block management information BBMI may be written in the specific area in the nonvolatile memory device. The specific area may be an area which is accessible through a specific command.

In operation S40, the reliability of data stored in the specific area may be tested. That is, whether a fault or an error exists at the specific area where the bad block management information BBMI is stored may be detected. In the case where provision of the bad block management information BBMI is not secured due to the fault of the specific area, a nonvolatile memory device corresponding thereto may be determined as being a defective. However, the nonvolatile memory device of the inventive concept may recover the bad block management information BBMI easily even though the defect of a column direction or an error exists. According to an exemplary embodiment of the inventive concept, since a defect rate is markedly improved, the yield may be markedly improved.

Figure 2:
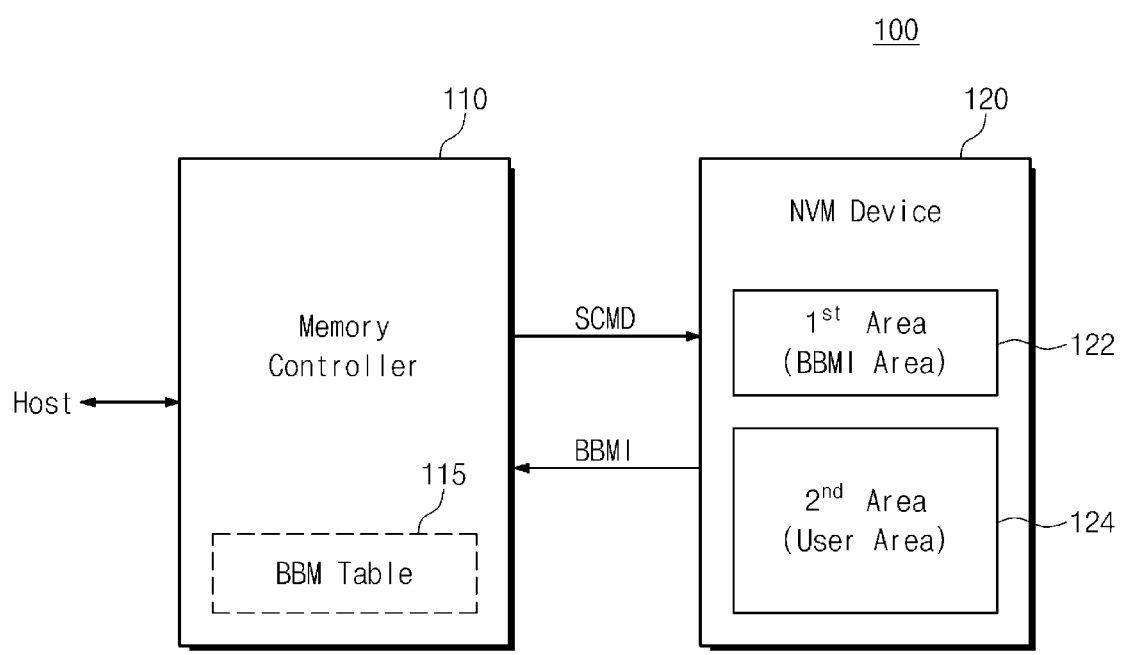
FIG. 2 is a block diagram illustrating a storage device according to an exemplary embodiment.

FIG. 2 is a block diagram illustrating a storage device according to an exemplary embodiment. Referring to FIG. 2, a storage device 100 may include a memory controller 110 and a nonvolatile memory device 120.

The memory controller 110 may be configured to control the nonvolatile memory device 120 in response to a request of a host. The memory controller 110 may provide an interface between the nonvolatile memory device 120 and the host. The memory controller 110 may control the nonvolatile memory device 120 in response to a write request of the host so as to write data. Furthermore, the memory controller 110 may control a read operation of the nonvolatile memory device 120 in response to a read command from the host.

The memory controller 110 may drive software (or firmware) which is called a flash translation layer (FTL) for controlling the nonvolatile memory device 120. The flash translation layer FTL may provide interfacing for hiding an erase operation of the nonvolatile memory device 120 between a file system of the host and the nonvolatile memory device 120. Disadvantages of the nonvolatile memory device 120 such as mismatch between an erase unit and a write unit and erase-before-write may be redeemed through the flash translation layer FTL. Furthermore, at a write operation of the nonvolatile memory device 120, the flash translation layer FTL may map a logical address LA., which the file system generates, onto a physical address PN of the nonvolatile memory device 120.

According to an exemplary embodiment of the inventive concept, the memory controller 110 may read the bad block management information BBMI from the nonvolatile memory device 120. The bad block management information BBMI may include characteristic information about a bad block included in the nonvolatile memory device 120. For example, the bad block management information BBMI may include the number of bad blocks included in the nonvolatile memory device 120 or locations thereof. The bad block management information BBMI may be generated by integrating results detected in various test processes for producing the nonvolatile memory device 120. Accordingly, the memory controller 110 may read the bad block management information BBMI to generate a bad block management table 115 for blocking an access to a bad block. The host may seize a state about bad blocks of the nonvolatile memory device 120 based on the bad block management table 115 that the memory controller 110 generates. The host may prevent an error due to a wrong access to a bad block.

The nonvolatile memory device 120 may perform writing, reading and erasing according to control of the memory controller 110. The nonvolatile memory device 120 may include a plurality of memory blocks, each of which includes a plurality of memory cells arranged in rows and columns. Each of the memory cells may store a multi-level (or multi-bit) data. The memory cells may be arranged to have a two-dimensional array structure or a three-dimensional (or vertical) array structure.

The nonvolatile memory device 120 may include a plurality of memory blocks BLK1 to BLKi. Each of the memory blocks BLK1 to BLKi may correspond to an erase unit. Each of the memory blocks BLK1 to BLKi may include a plurality of memory cells which is stacked in a direction perpendicular to a substrate so as to constitute a cell string. Alternatively, each of the memory blocks BLK1 to BLKi may be configured such that a plurality of cell strings is stacked in a direction parallel with the substrate. As the memory blocks BLK1 to BLKi are formed to have the above-described three-dimensional structure, the capacity of one memory block may be markedly increased.

A storage area of the nonvolatile memory device 120 may be divided into at least two areas based on a function. The storage area of the nonvolatile memory device 120 may be divided into a first area 122 in which the bad block management information BBMI or the memory management information is stored and a second area 124 in which user data is stored. The bad block management information stored in the first area 122 should not be damaged or changed by a user or any other user. Accordingly, it may be very dangerous for an end user to access the first area 122 easily. The first area 122 may be an area which is accessible by a specific command SCMD. In contrast, the second area 124 may be accessible by an end user and may be used to store a variety of data. The nonvolatile memory device 120 according to an exemplary embodiment of the inventive concept may be accessible using the specific command SCMD and may output the bad block management information BBMI.

In particular, the bad block management information stored in the first area 122 may be programmed several times for reliability. For example, the same bad block management information BBMI may be iteratively written at a plurality of pages. However, the bad block management information BBMI may be distributed at different columns in such pages. As the same bad block management information BBMI is stored at different column locations, high reliability may be provided with respect to a defect arising in a column direction or a bit line direction. This structure will be described in detail with reference to accompanying drawings.

With the above description, the storage device 100 according to an exemplary embodiment of the inventive concept may iteratively program the bad block management information BBMI at different column locations in the first area 122. The first area 122 may be accessed by a specific command SCMD dedicated for the access to the first area 122. The memory controller 110 may access the first area of the nonvolatile memory device 120 using the specific command SCMD and may read the bad block management information BBMI. The read bad block management information BBMI may be rearranged based on locations of programmed columns, and the rearranged bad block management information BBMI may be extracted according to a multi-bit decision manner. The extracted bad block management information BBMI may be used to construct a bad block management table 115 for managing bad blocks.

An exemplary embodiment of the inventive concept will be exemplified as a NAND flash memory is used as a storage medium of the nonvolatile memory device 120. However, the storage medium of the nonvolatile memory device 120 may be composed of other nonvolatile memory devices. For example, the storage medium of the nonvolatile memory device 120 may be implemented with a PRAM, a MRAM, a ReRAM, a FRAM, a NOR flash memory, and the like, and a memory system including different types of memory devices may be used as the storage medium of the nonvolatile memory device 120. In particular, the technical features of the inventive concept may be applied to a storage device such as a solid state drive (SSD). In this case, the memory controller 110 may communicate with a host through one of various interface protocols such as USB, MMC, PCI-E, SATA, PATA, IDE, E-IDE, SCSI, ESDI, and SAS.

Figure 3:
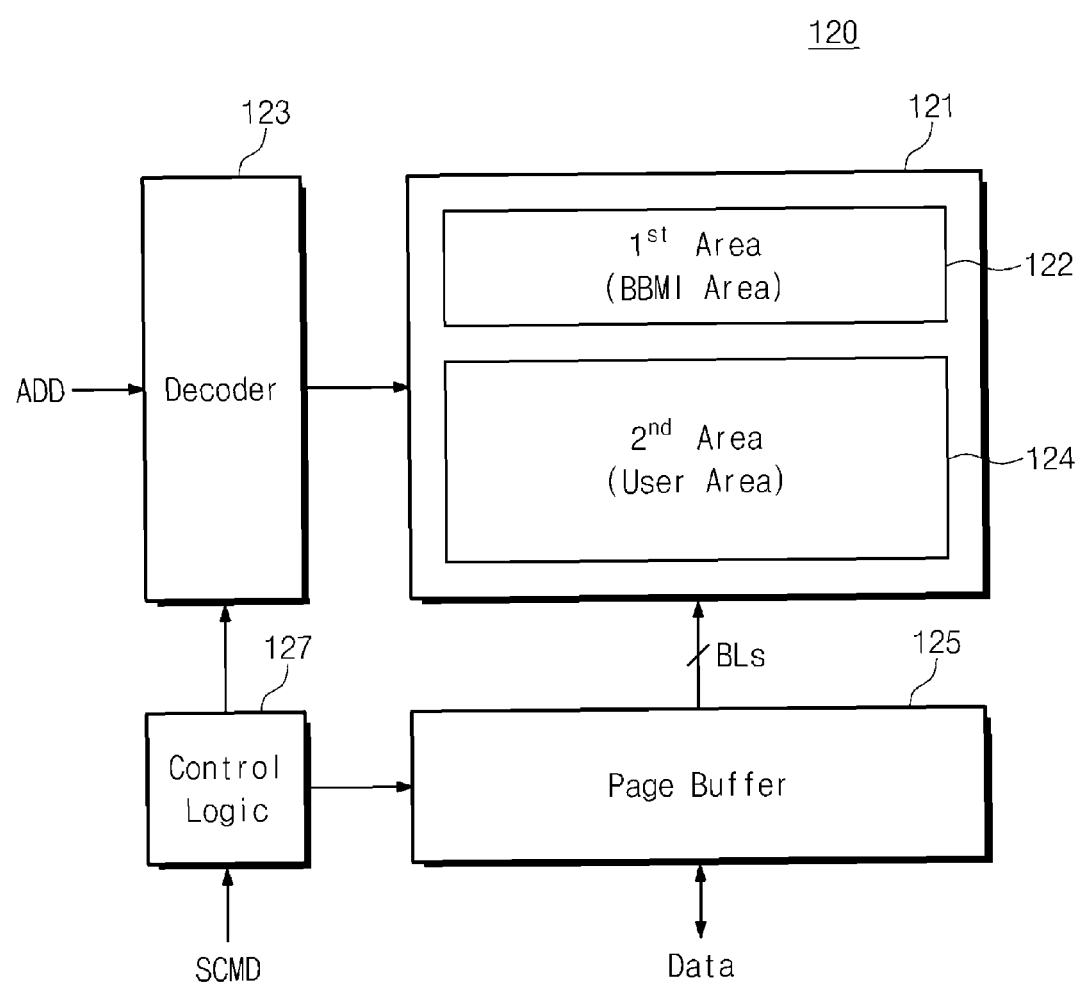
FIG. 3 is a block diagram schematically illustrating a nonvolatile memory device of FIG. 2.

FIG. 3 is a block diagram schematically illustrating a nonvolatile memory device 120 of FIG. 2. Referring to FIG. 3, a nonvolatile memory device 120 may include a memory cell array 121, a decoder 123, a page buffer 125, and control logic 127.

The memory cell array 121 may be connected to the decoder 123 through word lines or selection lines. The memory cell array 121 may be connected to the page buffer 125 through bit lines. The memory cell array 121 may include a plurality of NAND cell strings. The cell strings may form a plurality of memory blocks BLK1 to BLKi based on an operation or selection unit.

The memory cell array 121 may be divided into at least two areas: the first area 122 and the second area 124. The bad block management information BBMI or the memory management information may be stored in the first area 122. A variety of user data may be stored in the second area 124.

Here, a channel of each cell string may be formed in a vertical or horizontal direction. In the memory cell array 121, the word lines may be stacked in a vertical direction, and a channel of each cell string may be formed in the vertical direction. A memory device of which the memory cell array 121 is formed to have the cell string structure may be referred to as "vertical-structure nonvolatile memory device" or "three-dimensional nonvolatile memory device".

The decoder 123 may select one of memory blocks of the memory cell array 121 in response to an address ADD. The decoder 123 may select one of the word lines in the selected memory block. The decoder 123 may transfer a word line voltage to the selected word line. At a program operation, the decoder 123 may transfer a program voltage and a verification voltage to a selected word line and a pass voltage to an unselected word line.

The page buffer 125 may operate as a write driver or a sense amplifier based on an operating mode. At a program operation, the page buffer 125 may transfer a bit line voltage corresponding to data to be programmed at a bit line of the memory cell array 121. At a read operation, the page buffer 125 may sense data stored in a selected memory cell through a bit line. The page buffer 125 may latch the sensed data and may output the latched data to an external device.

The control logic 127 may control the page buffer 125 and the decoder 123 in response to the specific command SCMD from the external device. The control logic 127 may erase a selected memory block (or a physical block) at erasing. The control logic 127 may control the decoder 123 and the page buffer 125 in response to the specific command SCMD so as to output data stored in the first area 122 or so as to program input data at the first area 122.

The nonvolatile memory device 120 according to an exemplary embodiment of the inventive concept may iteratively program the bad block management information BBMI at different memory areas. In particular, the bad block management information BBMI stored in the first area 122 may be iteratively programmed at different column locations. Accordingly, it may be possible to provide the bad block management information BBMI with high reliability with regard to a column direction defect.

Figure 4:
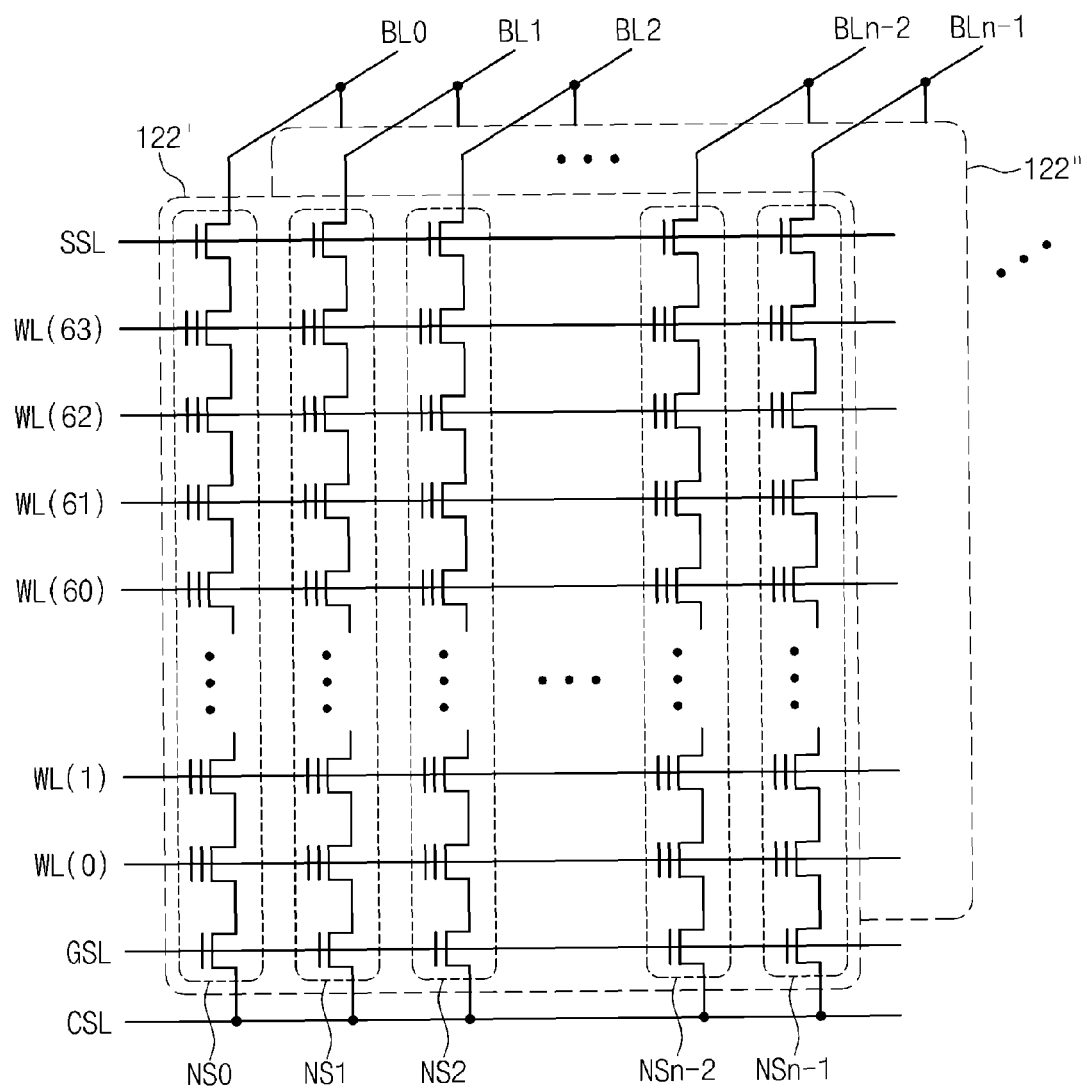
FIG. 4 is a circuit diagram schematically illustrating a configuration of a first area of FIG. 3.

FIG. 4 is a circuit diagram schematically illustrating a configuration of a first area of FIG. 3. In FIG. 4, there is illustrated a part of a memory block included in the first area 122. A plurality of NAND cell strings NSi may be included in one memory block. The NAND cell strings NSi may be formed in a direction perpendicular or horizontal to a substrate.

Cell strings included in the same memory block may be connected to the same common source line CSL. NAND cell strings may be connected to different bit lines BL0 to BLn−1. When a defect arises from any one cell string (e.g., NS2) included in a memory block, remaining cell strings, connected to a bit line BL2, other than the defective cell string may be affected. This defect may be called a column defect.

Furthermore, even though no circuit defect exists, data different from stored data may be read due to the fact that a characteristic of a memory cell is different from that of another memory cell. This defect may be called a bit error. Besides such defects, memory cells may deteriorate due to an increase in the number of program/erase cycles or an increase in a time elapsing from a point in time when data is stored. Therefore, a string which includes a lot of deteriorated memory cells may have relatively low integrity of data.

The bad block management information BBMI may be iteratively programmed at different rows. In addition, the bad block management information BBMI may be stored at different column locations. Therefore, if a manner of programming the bad block management information BBMI of the nonvolatile memory device 120 is used, reliable bad block management information BBMI may be provided with respect to the bit error and the column direction defect.

FIG. 5 is a diagram schematically illustrating a pattern in which bad block management information BBMI according to an exemplary embodiment of the inventive concept is programmed. Referring to FIG. 5, it may be assumed that bad block management information BBMI stored in the first area 122 is "abcdefgh". The bad block management information BBMI may be iteratively programmed at different rows of the first area 122. In particular, in the different rows, the bad block management information "abcdefgh" may be programmed at different column locations.

With regard to a first row R0, the bad block management information "abcdefgh" may be programmed from a first column Y0. With regard to a second row R2, the bad block management information "abcdefgh" may be programmed from a second column Y1. With regard to a third row R3, the bad block management information "abcdefgh" may be programmed from a third column Y2. As described above, in different rows, the bad block management information "abcdefgh" may be iteratively programmed at different column locations. In an exemplary embodiment, logical "1" indicating an erase state may be stored at respective memory cells where the bad block management information "abcdefgh" is not programmed.

Figure 6:
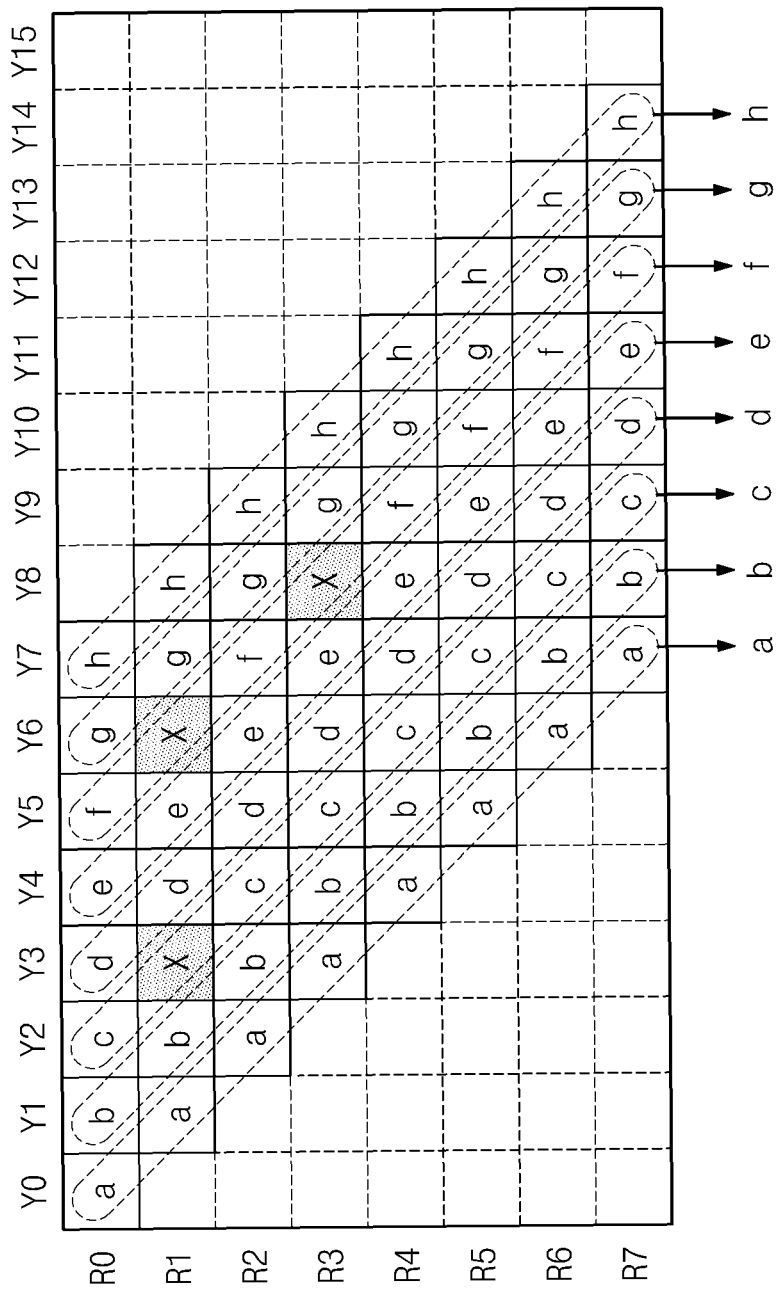
FIG. 6 is a diagram schematically illustrating a method for identifying bad block management information written with a pattern of FIG. 5.

FIG. 6 is a diagram schematically illustrating a method for identifying bad block management information written with a pattern of FIG. 5. Referring to FIG. 6, even though a bit error occurs, original data may be easily recovered using the bad block management information according to a program method of the inventive concept. It may be assumed that bit errors X occur from second and fourth rows R1 and R3 where bad block management information "abcdefgh" is programmed.

At a read operation, the memory controller 110 may read the bad block management information "abcdefgh" programmed at different rows (or pages). With regard to each row, the memory controller 110 may perform rearrangement of the bad block management information "abcdefgh" to remove a portion corresponding to invalid data. Here, the rearrangement may mean shifting column locations of the bad block management information "abcdefgh" included in respective rows as many as the specific number of columns, so as to correspond to each other.

With regard to data (or page) read from the first row R0, invalid data may be removed from a column Y8 without shifting. With regard to data read from the second row R1, a bit corresponding to a first column Y0 and bits following an eighth column Y8 may be removed, and the read bad block management information "abcdefgh" may be shifted left by one bit. With regard to data read from the third row 2, bits corresponding to first and second columns Y0 and Y1 and bits following a ninth column Y9 may be removed, and the read bad block management information "abcdefgh" may be shifted left by two bits. With the above description, pieces of bad block management information "abcdefgh" read from eight rows R0 to R7 of the first area 122 may be rearranged such that the same bits are located at the same columns.

After rearranging, majority decision about each column may be performed. The rearranged data corresponding to the first column Y0 may include eight bits of "a". Therefore, a bit of the first column may be determined according to the majority decision as being "a". The rearranged data corresponding to the second column Y1 may include eight bits of "b". Therefore, a bit of the second column may be determined according to the majority decision as being "b". The rearranged data corresponding to the third column Y2 may include seven bits of "c" and one error bit X. Therefore, even though a bit error exists, a bit of the third column may be determined according to the majority decision as being "c".

The rearranged data corresponding to the fourth column Y3 may include eight bits of "d" without an error bit. Therefore, a bit of the fourth column may be determined according to the majority decision as being "d". The rearranged data corresponding to the fifth column Y4 may include eight bits of "e" without an error bit. Therefore, a bit of the fifth column may be determined according to the majority decision as being "e".

The rearranged data corresponding to the sixth column Y5 may include six bits of "f" and 2 error bits X. Therefore, even though two error bits exist, a bit of the sixth column may be determined according to the majority decision as being "f". The rearranged data corresponding to the seventh column Y6 may include eight bits of "g" without an error bit. Therefore, a bit of the seventh column may be determined according to the majority decision as being "g". The rearranged data corresponding to the eighth column Y7 may include eight bits of "h" without an error bit. Therefore, a bit of the eighth column may be determined according to the majority decision as being "h".

A method for reading bad block management information BBMI stored in the first area 122 and rearranging columns thereof is described. In particular, even though a bit error X exists, the bad block management information BBMI may be easily recovered according to the majority decision.

Figure 7:
FIG. 7 is a diagram schematically illustrating a method for reading and rearranging bad block management information illustrated in FIG. 6.
Figure 7:

FIG. 7 is a diagram schematically illustrating a method for reading and rearranging bad block management information illustrated in FIG. 6. Referring to FIG. 7, bad block management information may be easily recovered even though a bit error exists at bad block management information stored in the first area 122.

(a) illustrates the unit by which the bad block management information BBMI is read. The bad block management information BBMI may be read by the row (or by the page). Here, it may be assumed that two bit errors X exist at a second row R1 and one bit error X exists at a fourth row R3. With regard to each row, logical "1" may be read from an invalid data area other than an area where the bad block management information "abcdefgh" is stored.

(b) illustrates a method for rearranging the read bad block management information "abcdefgh". The bad block management information "abcdefgh" may be programmed such that start columns of rows are different from each other. Therefore, with regard to each row, shifting may be performed as many as the number of invalid bits before a start column thereof. After the bad block management information "abcdefgh" of each row is rearranged, as illustrated in FIG. 7, the same bits may be located at the same columns. Since being not associated with the majority decision, invalid data 125 which is a set of invalid bits read as logical "1" may be removed.

(c) shows the bad block management information "abcdefgh" determined according to the majority decision. The rearranged data corresponding to the first column y0 may include eight bits of "a". Therefore, a bit of the first column y0 may be determined according to the majority decision as being "a". The rearranged data corresponding to the second column y1 may include eight bits of "b". Therefore, a bit of the second column y1 may be determined according to the majority decision as being "b". The rearranged data corresponding to the third column y2 may include seven bits of "c" and one error bit X. However, even though a bit error exists, a bit of the third column y2 may be determined according to the majority decision as being "c".

The rearranged data corresponding to the fourth column y3 may include eight bits of "d" without an error bit. Therefore, a bit of the fourth column y4 may be determined according to the majority decision as being "d". The rearranged data corresponding to the fifth column y4 may include eight bits of "e" without an error bit. Therefore, a bit of the fifth column y4 may be determined according to the majority decision as being "e". The rearranged data corresponding to the sixth column y5 may include six bits of "f" and 2 error bits X. Therefore, even though two error bits exist, a bit of the sixth column y5 may be determined according to the majority decision as being "f". When the majority decision is applied to the seventh and eighth columns y6 and y7, a bit of the seventh column y6 and a bit of the eighth column y7 may be determined according to the majority decision as being "g" and "h", respectively.

In addition, invalid data 125 which are located from a ninth column y8 may be excluded from the majority decision. That is, invalid data may be discarded.

Figure 8:
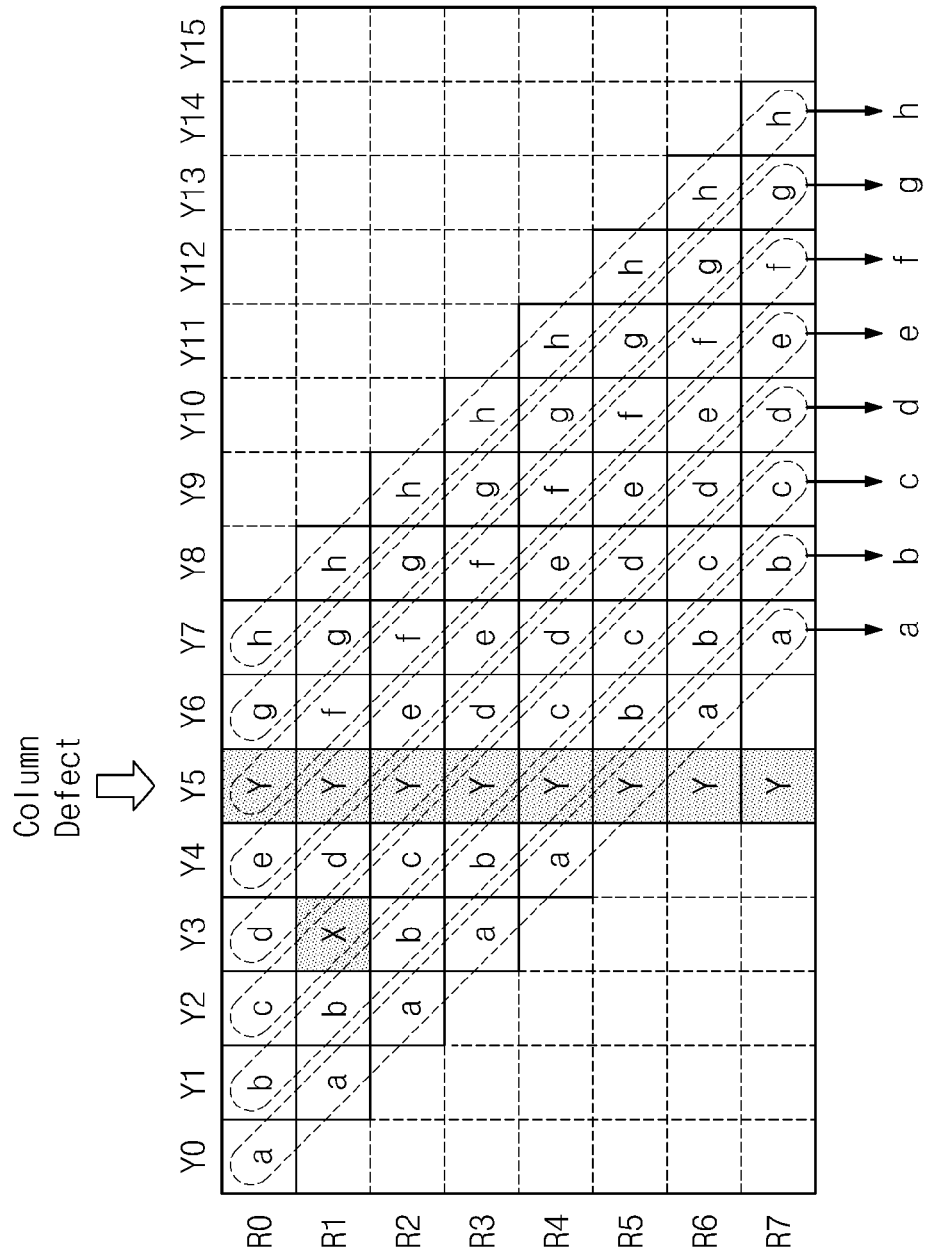
FIG. 8 is a diagram schematically illustrating a method for identifying bad block management information written with a pattern of FIG. 5.

FIG. 8 is a diagram schematically illustrating a method for identifying bad block management information written with a pattern of FIG. 5. According to a program method of the inventive concept, the bad block management information "abcdefgh" may be easily recovered to original data even though a column direction defect Y occurs. It may be assumed that a column direction defect exists at a sixth column Y5 of an area where the bad block management information "abcdefgh" is programmed. In addition, it may be understood that bit errors X additionally occur.

At a read operation, the memory controller 110 may read the bad block management information "abcdefgh" programmed at different rows (or pages). With regard to each row, the memory controller 110 may perform data rearrangement to discard a portion corresponding to invalid data. Here, the data rearrangement may mean an operation in which reverse shifting is performed by a column offset applied to each row at a program operation and an invalid portion of each row is discarded.

A method for reading and rearranging data of each row and applying majority decision to each column may be substantially the same as described with reference to FIG. 6, and a detailed description thereof is thus omitted. Even though the column direction defect Y and the bit error X exist, the bad block management information "abcdefgh" may be recovered if the majority decision is applied to columns of rearranged data. The reason may be that in the case where rows are sequentially shifted, the bad block management information "abcdefgh" not affected by the defect exists in at least one row even though the column direction defect exists. In addition, programmed data may be sufficiently estimated by applying the majority decision to rows where the column direction defect (e.g., weak column) exists.

A method for reading bad block management information BBMI stored in the first area 122 and rearranging columns thereof is described. In particular, bad block management information BBMI of respective rows which are located at different columns may be easily recovered even though the column direction defect Y exists.

Figure 9:
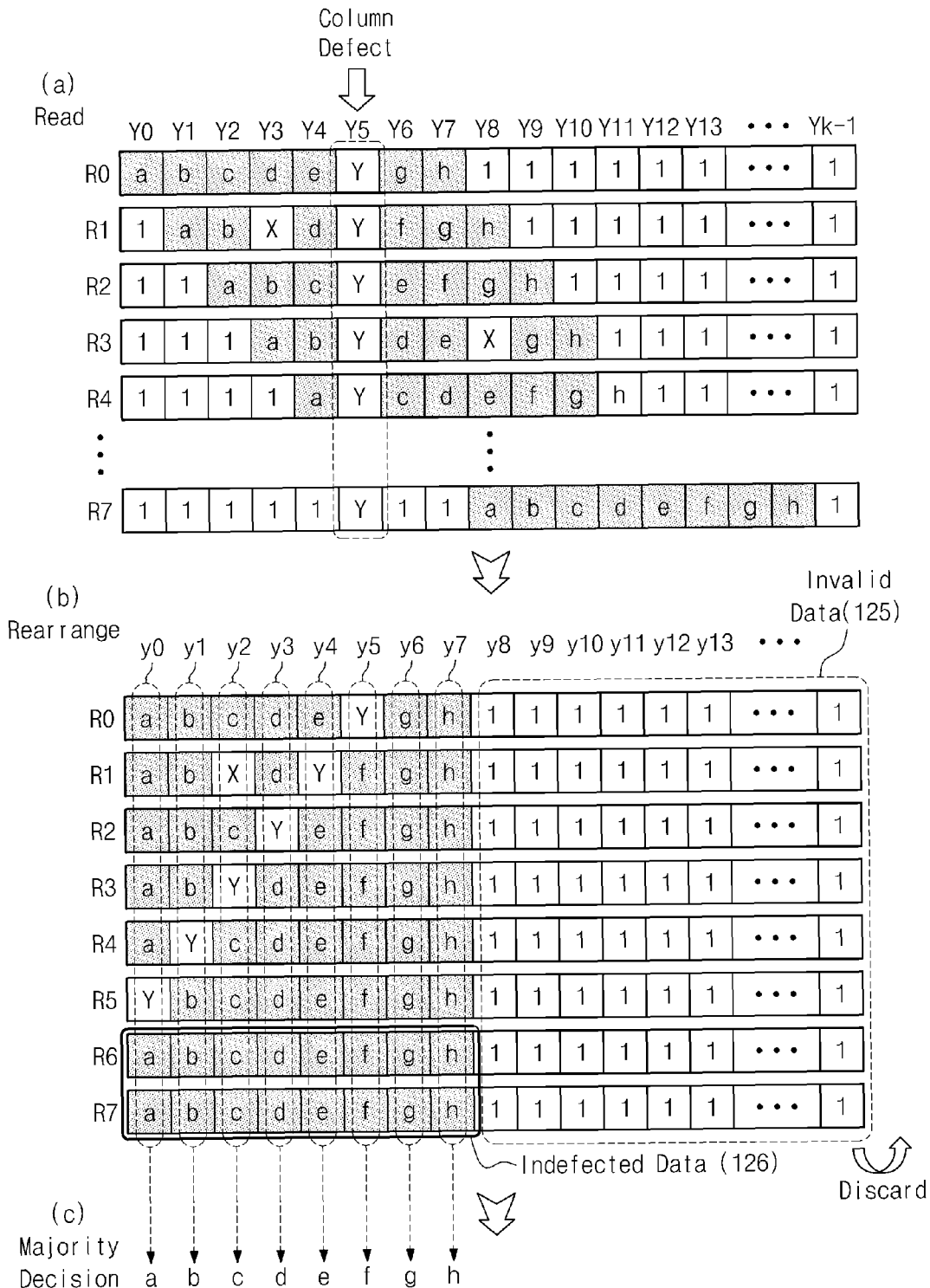
FIG. 9 is a diagram schematically illustrating a method for reading and rearranging bad block management information illustrated in FIG. 8.

FIG. 9 is a diagram schematically illustrating a method for reading and rearranging bad block management information illustrated in FIG. 8. Referring to FIG. 9, bad block management information may be easily recovered even though the bad block management information stored in the first area 122 includes a bit error X or a column direction defect Y.

(a) illustrates the unit by which bad block management information is read. The bad block management information BBMI may be programmed at one page one or more times. Therefore, a read operation may be performed by the row or the page to extract the bad block management information BBMI from the first area 122. It may be assumed that the column direction defect Y exists at a sixth column y5 with regard to each row. It may be assumed that with regard to each row, logical "1" is read from an invalid data area other than an area where the bad block management information "abcdefgh" is programmed.

(b) illustrates rearranged bad block management information of each row. Since a column offset is used at rearrangement such that rows have different start columns, the bad block management information "abcdefgh" may be reversely shifted by a column offset of each row at rearrangement. Referring to the rearranged bad block management information "abcdefgh", as illustrated in FIG. 9, the bits may be located at the same columns. Since being not associated with the majority decision of the inventive concept, invalid data 125 read as logical "1" may be discarded.

(c) illustrates the bad block management information determined according to the majority decision. Seven bits of "a" may exist at a first column y0 rearranged. Therefore, a bit of the rearranged first column y0 may be determined according to the majority decision as being "a". Seven bits of "b" may exist at a second column y1 rearranged. Therefore, a bit of the second column y1 may be determined according to the majority decision as being "b". Six bits of "c", one error bit X, and a column defect Y may exist at a third column y2 rearranged. However, even though a bit error or a column defect exists, a bit of the third column y2 may be determined according to the majority decision as being "c". In the case where the column direction defect is not fatal (i.e., in the case of weak column), the bad block management information may be easily recovered according to the majority decision.

To extract the bad block management information may be possible even though the column direction defect Y is a fatal defect to the extent that it is difficult to read data from memory cells located at a corresponding column. That is, a plurality of rows may include rows in which the column direction defect Y does not exist and from which the bad block management information "abcdefgh" is able to be read. For example, bad block management information 126 stored in the seventh and eighth rows R6 and R7 may be somewhat free from influence of the column direction defect Y. Therefore, it may be possible to extract the bad block management information "abcdefgh" by using bad block management information 126 stored in the seventh and eighth rows R6 and R7.

Figure 10A:
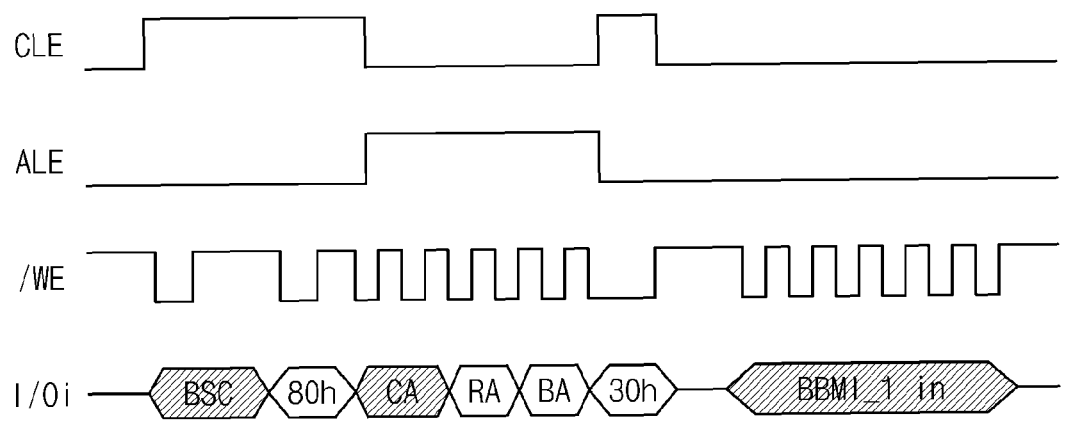
FIGS. 10A and 10B are timing diagrams schematically illustrating a method for accessing a nonvolatile memory device according to an exemplary embodiment.
Figure 10B:
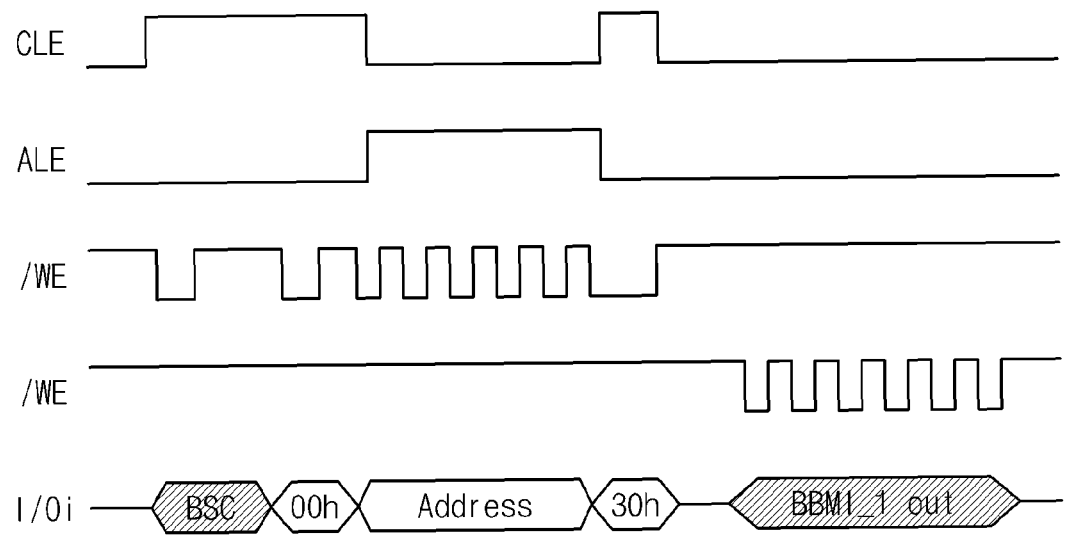

FIGS. 10A and 10B are timing diagrams schematically illustrating a method for accessing a nonvolatile memory device 120 according to an exemplary embodiment. FIG. 10A shows a command sequence for programming bad block management information BBMI at the first area 122 of the nonvolatile memory device 120. FIG. 10B shows a command sequence for reading the bad block management information BBMI from the first area 122 of the nonvolatile memory device 120.

Referring to FIG. 10A, a specific command BSC may be provided which is used to access the first area 121 for storing the bad block management information of the nonvolatile memory device 120. The specific command BSC may be provided to the nonvolatile memory device 120 in the case where a write enable signal/WE is toggled in a high section of a command latch enable signal CLE. Afterwards, a write command sequence 80 h may be received. An address of the first area 122 where the bad block management information BBMI is stored may be provided if the write enable signal/WE is toggled in a section where the command latch enable signal CLE transitions to a low level and an address latch enable signal ALE remains at a high level. According to an address input sequence, for example, a column address CA, a row address RA, and a block address BA may be provided. Afterwards, a command sequence 30 h may be provided, and bad block management information BBMI_1 corresponding to one page may be provided to the nonvolatile memory device 120 in synchronization with toggling of the write enable signal/WE. The above-described procedure may be repeated as many as the number of pages at each of which bad block management information BBMI is to be stored. In addition, a column address CA may increase by a specific column offset, as described above, with respect to each page.

The first area 122 where the bad block management information BBMI of the nonvolatile memory device 120 is stored may be an area which an end user does not access. Therefore, the specific command BSC may be used at a process where the bad block management information BBMI is written. Besides the above method, the specific command may be provided according to various manners. For example, the specific command may be provided such that a command register in the nonvolatile memory device 120 is specified through an address.

Referring to FIG. 10B, the specific command BSC may be required to read the bad block management information BBMI from the first area 122 of the nonvolatile memory device 120. The specific command BSC may be provided to the nonvolatile memory device 120 in the case where the write enable signal/WE is toggled in a high section of the command latch enable signal CLE. Afterwards, a read command sequence (00h-Address-30h) may be provided. A read command 00h may be provided to the nonvolatile memory device 120 in a high section of a command latch enable signal CLE. An address of the first area 122 where the bad block management information BBMI is stored may be provided if the write enable signal/WE is toggled in a section where an address latch enable signal ALE is activated. If a read command 30 h is received, the bad block management information BBMI may be output in synchronization with toggling of a read enable signal/RE.

In the case where an address is an address for reading a page, a page read operation may be performed by the number of events that the bad block management information BBMI is programmed. In addition, column addresses with different column offsets may be included in corresponding command sequences, respectively.

A command sequence for accessing the first area 122 where the bad block management information BBMI of the nonvolatile memory device 120 is stored is exemplified. The specific command BSC may be used to access the first area 122 where the bad block management information BBMI of the inventive concept is stored. An access to the second area 124 may be possible without the specific command BSC, while an access to the first area 122 is blocked if the specific command BSC is not used.

Figure 11:
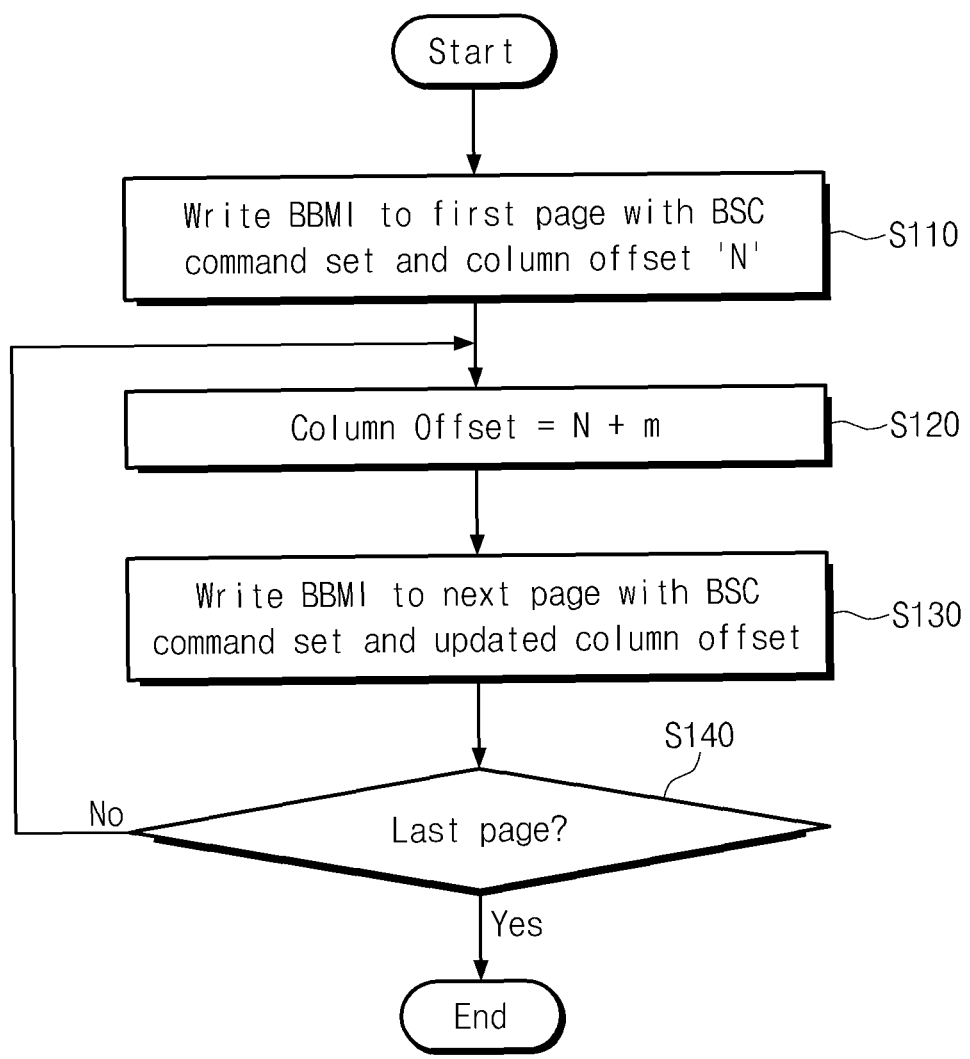
FIG. 11 is a diagram schematically illustrating a method for programming bad block management information, according to an exemplary embodiment.

FIG. 11 is a diagram schematically illustrating a method for programming bad block management information, according to an exemplary embodiment of the inventive concept. Referring to FIG. 11, test equipment or system may apply different column offsets to respective rows to write bad block management information in the nonvolatile memory device 120.

In operation S110, the bad block management information BBMI may be programmed at a first page by the specific command BSC. The bad block management information BBMI may be programmed at the first page under the condition that a column offset is "N". Here, N may be 0 or a natural number. In the case where bad block management information "abcdefgh" is written from a first column as described with reference to FIG. 5, a column offset may be set to have "0". However, as necessary, a column offset corresponding to the first page may be variously changed.

In operation S120, a column offset may increase or decrease. A value of "m" which is applied to the column offset to shift the bad block management information may increase or decrease. For descriptive convenience, it may be assumed that a shift value of "m" is added to the column offset. For FIG. 5, the shift value of "m" may be "1".

In operation S130, the bad block management information BBMI may be stored at a next page using the adjusted column offset. Here, the next page may correspond to a next word line selected according to a program sequence or may correspond to a next logical address.

In operation S140, whether the next page is the last page for storing the bad block management information BBMI may be determined. If the next page is not the last page (No), the method may proceed to operation S120, and thus the bad block management information BBMI to which a column offset adjusted as described above is applied may be programmed. However, if the next page is the last page or the number of events that the bad block management information BBMI is programmed is the same as a maximum value, the method may be ended.

There is described a program method in which a column offset used to store the bad block management information BBMI in the nonvolatile memory device 120 is variable. An exemplary embodiment of the inventive concept is exemplified as a column offset sequentially increases. However, the scope and spirit of the inventive concept may not be limited thereto. For example, the column offset may decrease or may alternately increase and decrease by a specific value.

Figure 12:
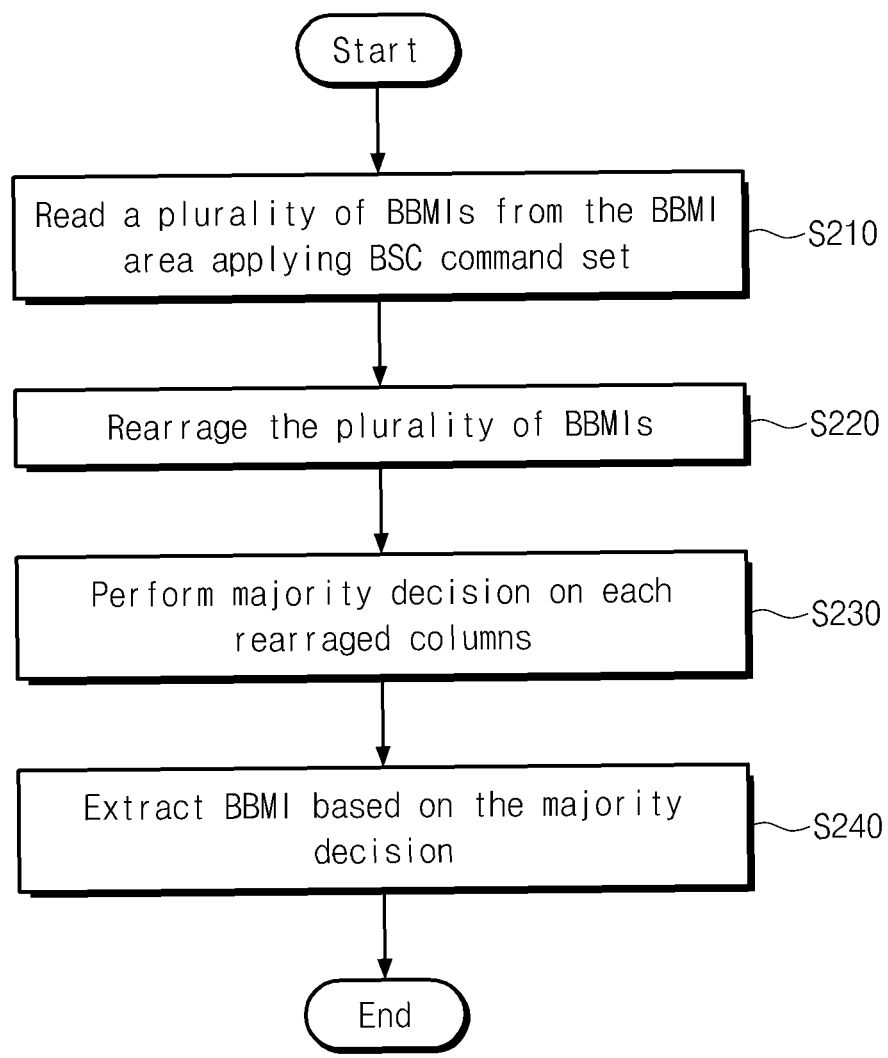
FIG. 12 is a flow chart schematically illustrating a method for reading bad block management information, according to an exemplary embodiment.

FIG. 12 is a flow chart schematically illustrating a method for reading bad block management information, according to an exemplary embodiment. Referring to FIG. 12, bad block management information BBMI programmed according to different column offsets may be read using a specific command BSC.

In operation S210, the bad block management information BBMI which is stored in the first area 122 of the nonvolatile memory device 120 may be read using a specific command. Pieces of page data to which different column offsets are applied may be read using the specific command BSC for accessing the first area 122.

In operation S220, a plurality of pages thus read may be rearranged in consideration of column offsets applied thereto. That is, each of the pages may be reversely shifted by a column offset applied when programmed. The pages reversely shifted may have the bad block management information BBMI at the same columns. Valid data included in each page may be discarded.

In operation S230, majority decision algorithm may be applied to respective columns thus rearranged. At this time, even though a bit error X or a column direction defect Y exists, the bad block management information BBMI may be recovered by the majority decision.

In operation S240, bad block management information may be extracted according to the majority decision algorithm. The extracted information may be determined as the bad block management information BBMI and may be provided to the bad block table 115 (refer to FIG. 2) as one item.

Methods for programming and reading the bad block management information BBMI are described with reference to FIGS. 11 and 12. However, the scope and spirit of the inventive concept may not be limited thereto, and the bad block management information BBMI may be accessed through various manners. For example, the specific command BSC may be provided by assigning a register using an address and may be activated using a specific control signal of the nonvolatile memory device 120.

FIGS. 13A to 13D are diagrams schematically illustrating various examples in which bad block management information of the inventive concept is programmed at a first area 122 of a nonvolatile memory device 120. Patterns illustrated in FIGS. 13A to 13D are only exemplary, and programming of the bad block management information at different column locations with regard to respective rows may be variously changed or modified.

Figure 13A:
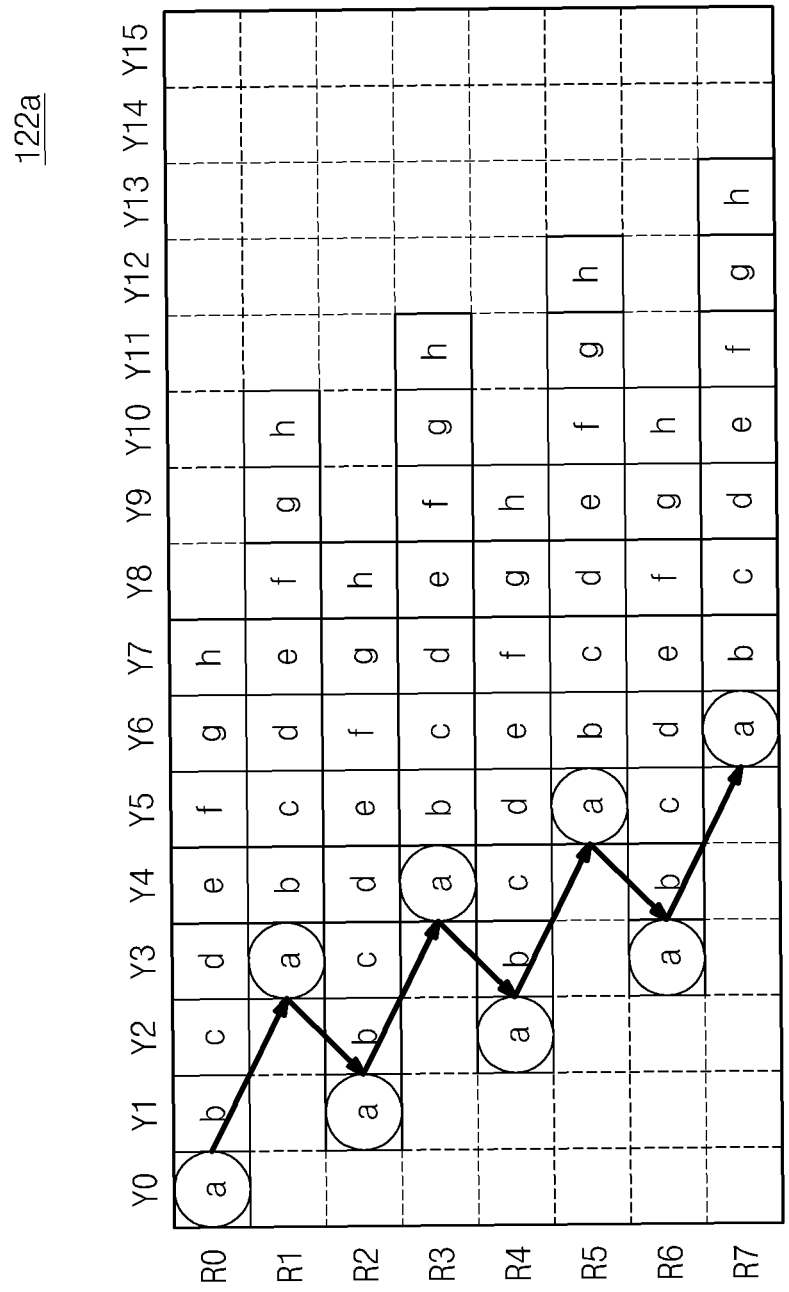

Referring to FIG. 13A, bad block management information "abcdefgh" may be programmed at a first row R0 with a column offset set to "0". The bad block management information "abcdefgh" may be programmed at a second row R1 with a column offset set to "+3" such that it is shifted right by three bits compared to the first row R0. The bad block management information "abcdefgh" may be programmed at a third row R2 with a column offset set to "−2" such that it is shifted left by two bits compared to the second row R1. The bad block management information "abcdefgh" may be programmed at a fourth row R3 with a column offset set to "+3" such that it is shifted right by three bits compared to the third row R2. The bad block management information "abcdefgh" may be programmed at rows of the first area 122 with the column offsets "+3" and "−2" alternatively applied thereto. In the case where the above-described program manner is used, pieces of data read from respective rows may be reversely shifted by column offsets "+3" and "−2" in rearranging the read data.

Figure 13B:
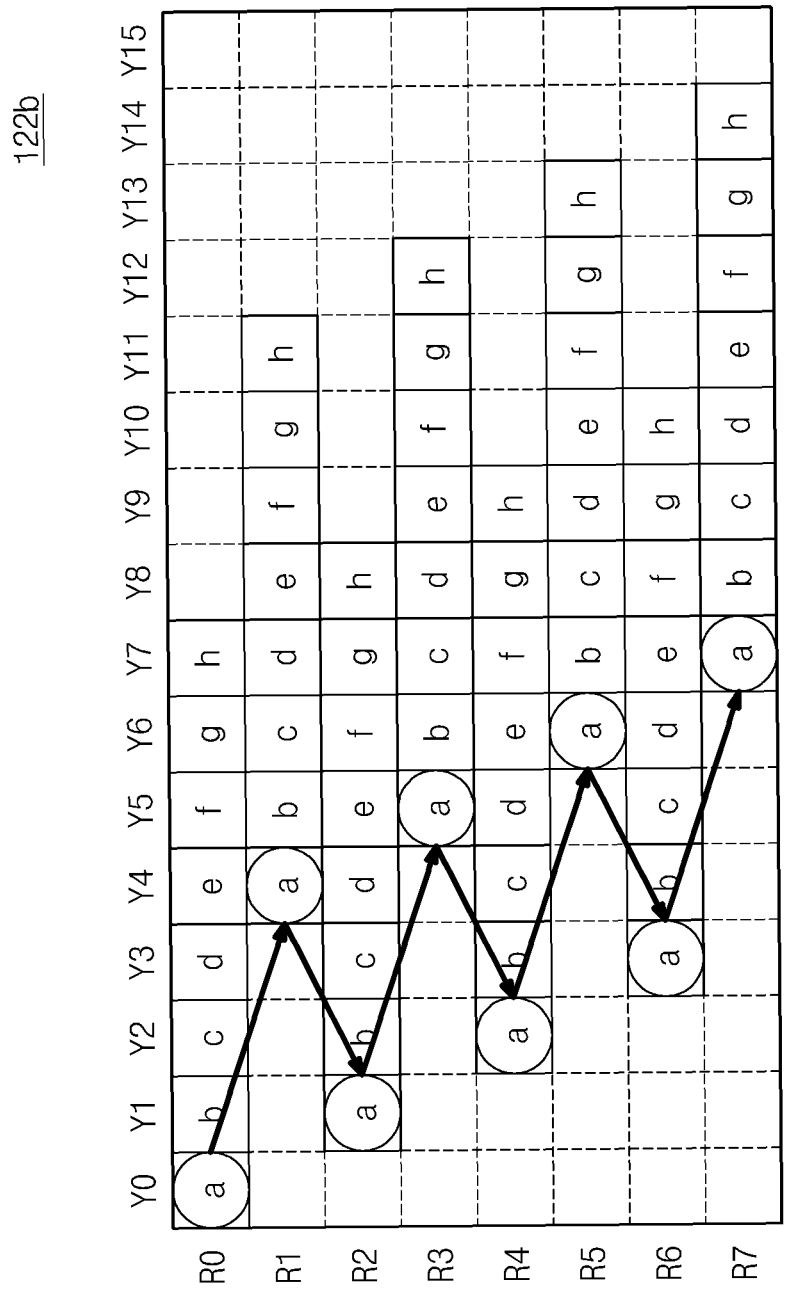

Referring to FIG. 13B, the bad block management information "abcdefgh" may be programmed at the first row R0 with a column offset set to "0". The bad block management information "abcdefgh" may be programmed at the second row R1 with a column offset set to "+4" such that it is shifted right by four bits compared to the first row R0. The bad block management information "abcdefgh" may be programmed at the third row R2 with a column offset set to "−3" such that it is shifted right by three bits compared to the second row R1. The bad block management information "abcdefgh" may be programmed at the fourth row R3 with a column offset set to "+4" such that it is shifted right by four bits compared to the third row R2. The bad block management information "abcdefgh" may be programmed at rows of the first area 122 with the column offsets "+4" and "−3" alternatively applied thereto. In the case where the above-described program manner is used, pieces of data read from respective rows may be reversely shifted by column offsets "+4" and "−3" in rearranging the read data.

Figure 13C:
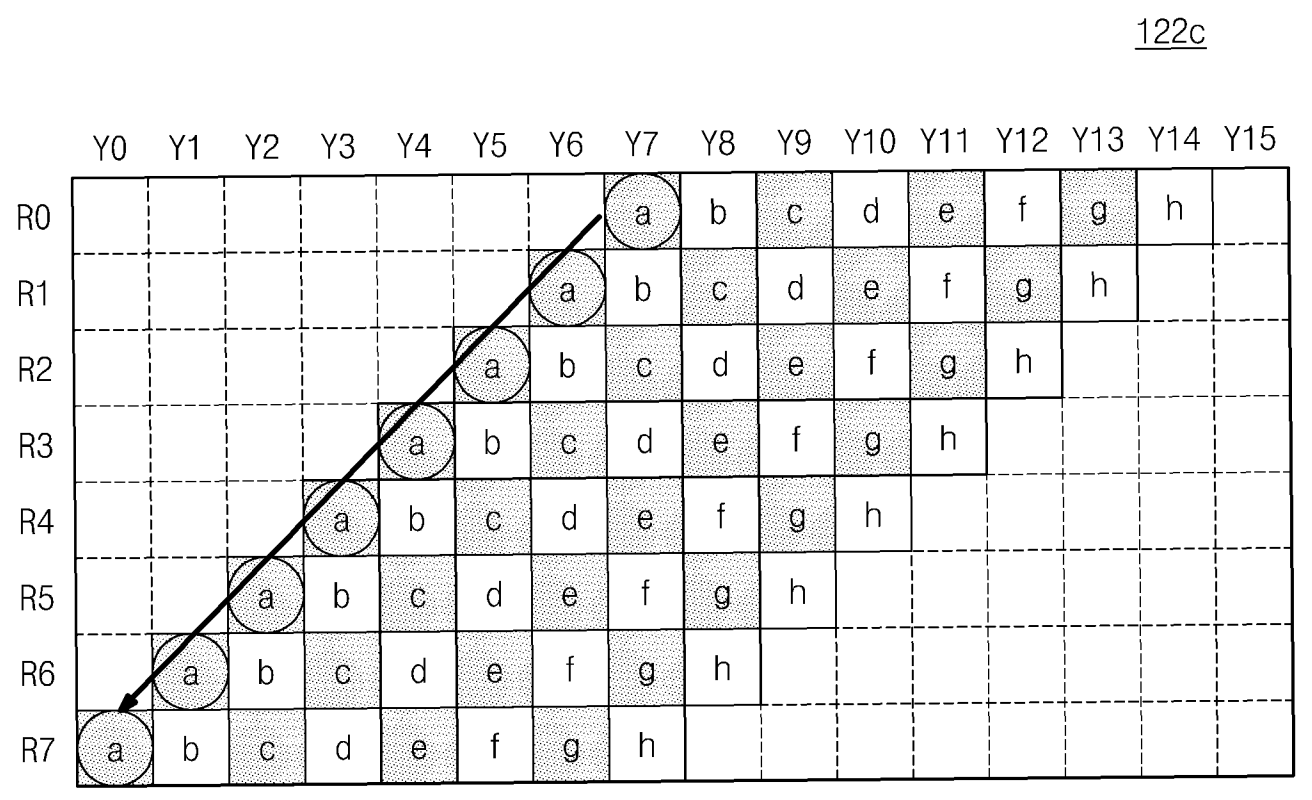

Referring to FIG. 13C, the bad block management information "abcdefgh" may be programmed at the first row R0 with a column offset set to "7". The bad block management information "abcdefgh" may be programmed at the second row R1 with a column offset set to "−1" such that it is shifted left by one bit compared to the first row R0. The bad block management information "abcdefgh" may be sequentially programmed at the third to eighth rows R2 to R7 such that it is shifted left by one bit. In the case where the above-described program manner is used, pieces of data read from respective rows may be reversely shifted by a column offset in rearranging the read data.

Figure 13D:
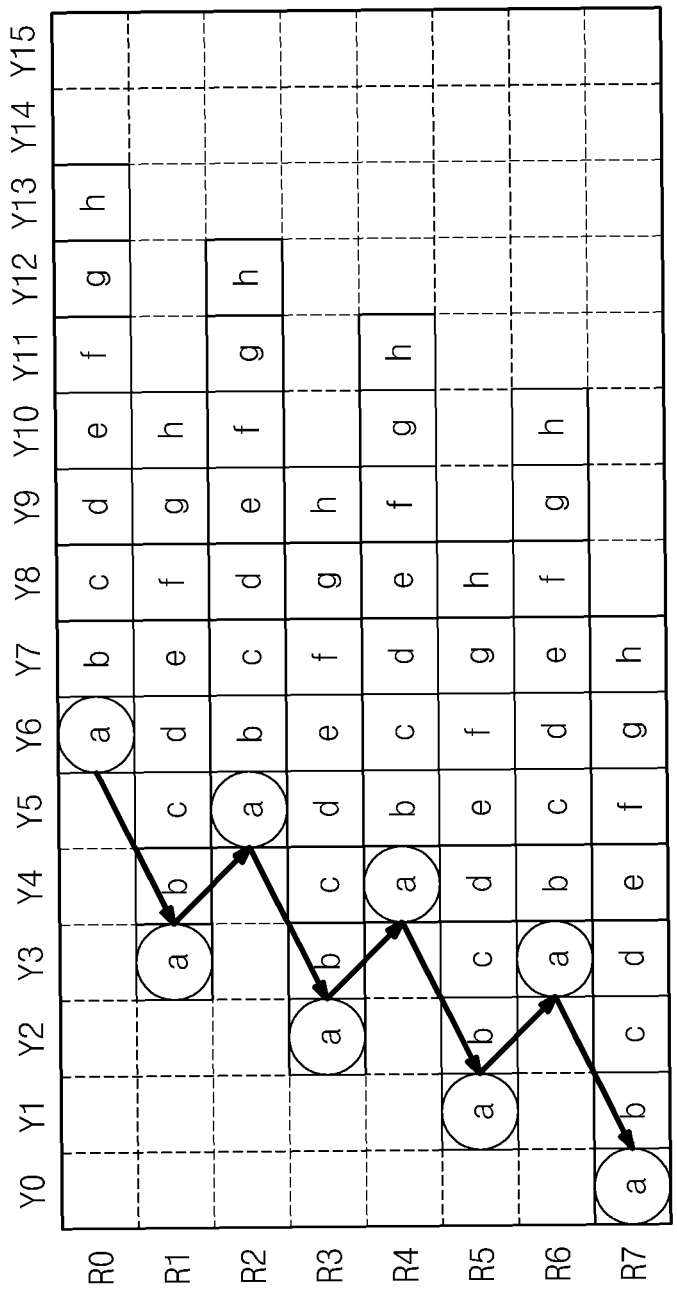

Referring to FIG. 13D, the bad block management information "abcdefgh" may be programmed at the first row R0 with a column offset set to "7". The bad block management information "abcdefgh" may be programmed at the second row R1 with a column offset set to "−3" such that it is shifted left by three bits compared to the first row R0. The bad block management information "abcdefgh" may be programmed at the third row R2 with a column offset set to "+2" such that it is shifted left by two bits compared to the second row R1. The bad block management information "abcdefgh" may be programmed at rows of the first area 122 with the column offsets "−3" and "+2" alternatively applied thereto. In the case where the above-described program manner is used, pieces of data read from respective rows may be reversely shifted by column offsets "−3" and "+2" in rearranging the read data.

Figure 14:
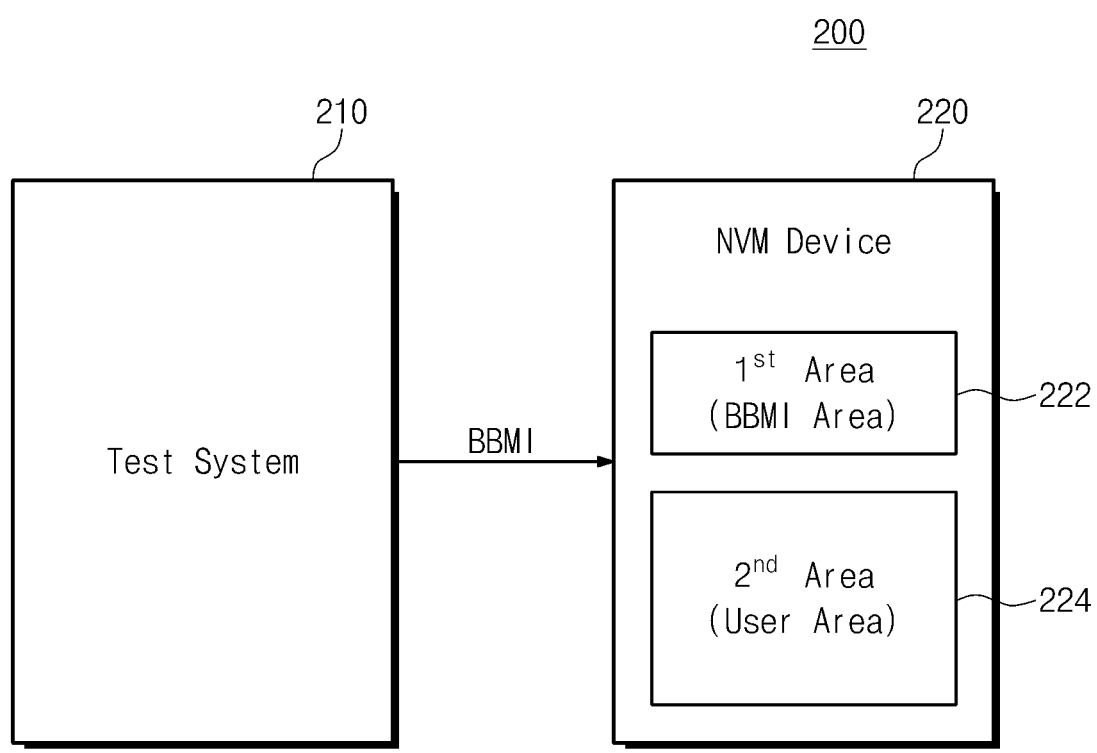
FIG. 14 is a block diagram schematically illustrating a nonvolatile memory device according to an exemplary embodiment.

FIG. 14 is a block diagram schematically illustrating a nonvolatile memory device according to an exemplary embodiment. Referring to FIG. 14, memory management information or bad block management information BBMI may be stored at a first area 222 of a nonvolatile memory device 220 according to an exemplary embodiment, based on a manner described with reference to FIGS. 3 to 13D. The user area 224 is similar to user area 124 of FIG. 3, thus the description of user area 224 is similar to the description of user area 124 of FIG. 3. A test system 210 may program the bad block management information BBMI or the memory management information about the nonvolatile memory device 220 obtained at a test process, at the first area 222 of the nonvolatile memory device 220. With regard to rows, the same bad block management information BBMI or memory management information may be programmed at different column locations.

Figure 15:
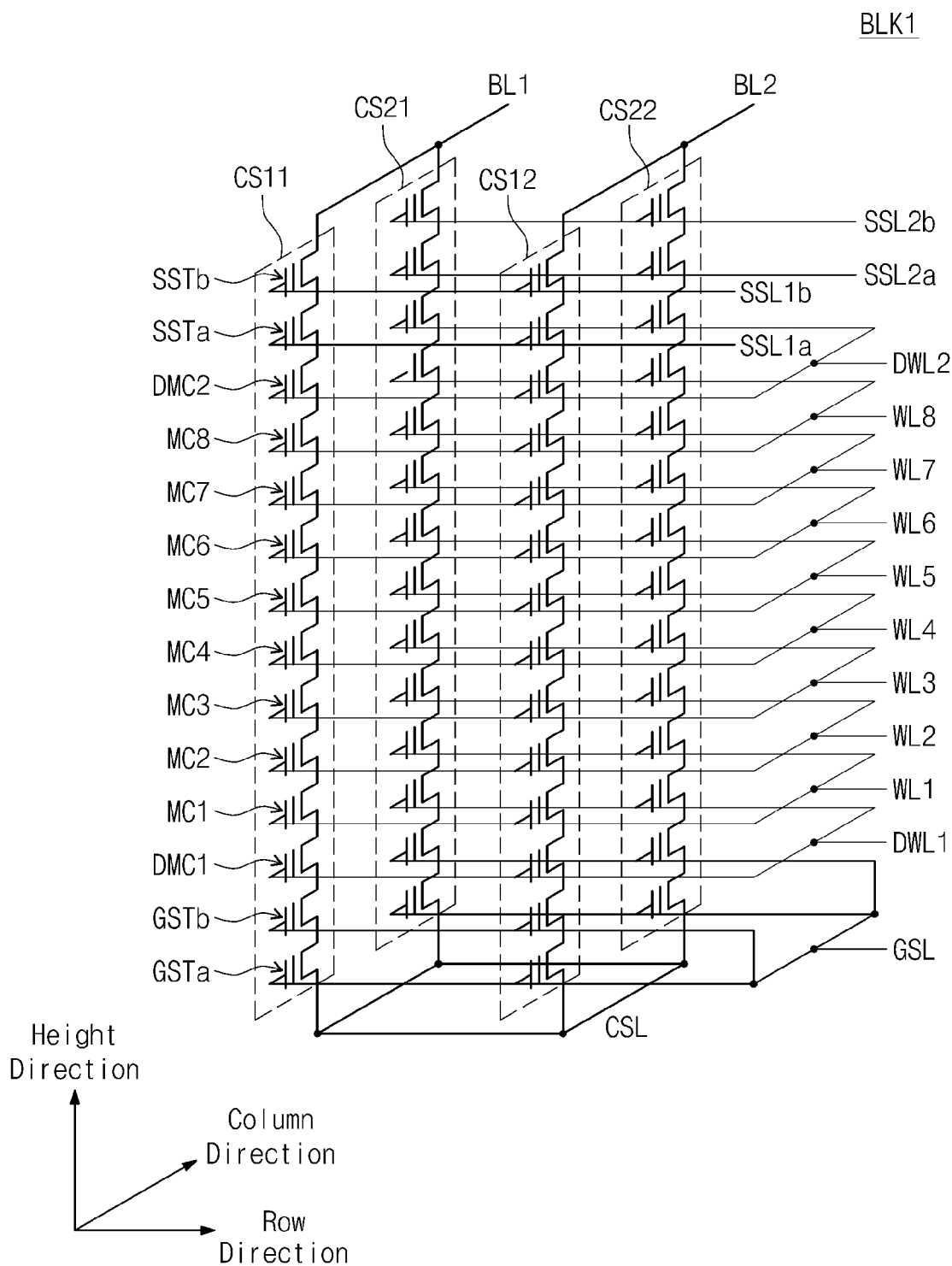
FIG. 15 is a circuit diagram schematically illustrating one of memory blocks included in a cell array of a nonvolatile memory device of FIG. 3.

FIG. 15 is a circuit diagram schematically illustrating one of memory blocks included in a cell array of a nonvolatile memory device of FIG. 3. In FIG. 15, there is illustrated a first memory block BLK1 having a three-dimensional structure. However, the scope and spirit of the inventive concept is not limited thereto. The remaining memory blocks may have the same structure as the first memory block BLK1.

Referring to FIG. 15, the first memory block BLK1 may include a plurality of cell strings CS11, CS21, CS12, and CS22. The cell strings CS11, CS21, CS12, and CS22 may be arranged along a row direction and a column direction and may form rows and columns. For example, the cell strings CS11 and CS12 may be connected to string selection lines SSL1a and SSL1b to form a first row. The cell strings CS21 and CS22 may be connected to string selection lines SSL2a and SSL2b to form a second row. For example, the cell strings CS11 and CS21 may be connected to a first bit line BL1 to form a first column. The cell strings CS12 and CS22 may be connected to a second bit line BL2 to form a second column.

Each of the cell strings CS11, CS21, CS12, and CS22 may include a plurality of cell transistors. Each of the cell strings may include string selection transistor SSTa and SSTb, a plurality of memory cells MC1 to MC8, ground selection transistors GSTa and GSTb, and dummy memory cells DMC1 and DMC2. In exemplary embodiments, each of the memory cells included in the cell strings CS11, CS12, CS21, and CS22 may be a charge trap flash (CTF) memory cell.

The memory cells MC1 to MC8 may be serially connected and may be stacked a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL. In exemplary embodiments, a first dummy memory cell DMC1 may be disposed between the memory cells MC1 to MC8 and the ground selection transistors GSTa and GSTb. In exemplary embodiments, a second dummy memory cell DMC2 may be disposed between the memory cells MC1 to MC8 and the string selection transistors SSTa and SSTb. The ground selection transistors GSTa and GSTb of the cell strings CS11, CS12, CS21, and CS22 may be connected in common to a ground selection line GSL.

In exemplary embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In exemplary embodiments, although not shown, ground selection transistors placed at the same height from a substrate may be connected to the same ground selection line, and ground selection transistors placed at different heights therefrom may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, the first to eighth memory cells MC8 of the cell strings CS11, CS12, CS21, and CS22 may be connected in common to first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In exemplary embodiments, dummy memory cells at the same height may be connected to the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2. In the first memory block BLK1, read and write operations may be performed by the row. For example, one row of the first memory block BLK1 may be selected by the string selection lines SSL1a, SSL1b, SSL2a, and SSL2b.

For example, the cell strings CS11 and CS12 of the first row may be connected to the first and second bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 of the second row may be connected to the first and second bit lines BL1 and BL2 when a turn-on voltage is supplied to the string selection lines SSL2a and SSL2b and a turn-off voltage is supplied to the string selection lines SSL1a and SSL1b. Memory cells, having the same height, from among memory cells of cell strings in a driven row may be selected by driving a word line. A read or write operation may be performed with respect to the selected memory cells. The selected memory cells may constitute a physical page.

In the first memory block BLK1, erasing may be performed by the memory block or by the sub-block. When erasing is performed by the memory block, all memory cells MC of the first memory block BLK1 may be simultaneously erased according to one erase request. When erasing is performed by the sub-block, a part of memory cells MC in the first memory block BLK1 may be simultaneously erased according to one erase request, and the other thereof may be erase-inhibited. A low voltage (e.g., a ground voltage) may be supplied to a word line connected to the erased memory cells, and a word line connected to erase-inhibited memory cells may be floated.

The first memory block BLK1 illustrated in FIG. 15 may be exemplary. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell strings (GST, MC, DMC, SST, or the like). Furthermore, the number of lines (GSL, WL, DWL, SSL, or the like) connected with cell transistors may increase or decrease according to the number of cell strings (GST, MC, DMC, SST, or the like).

Figure 16:
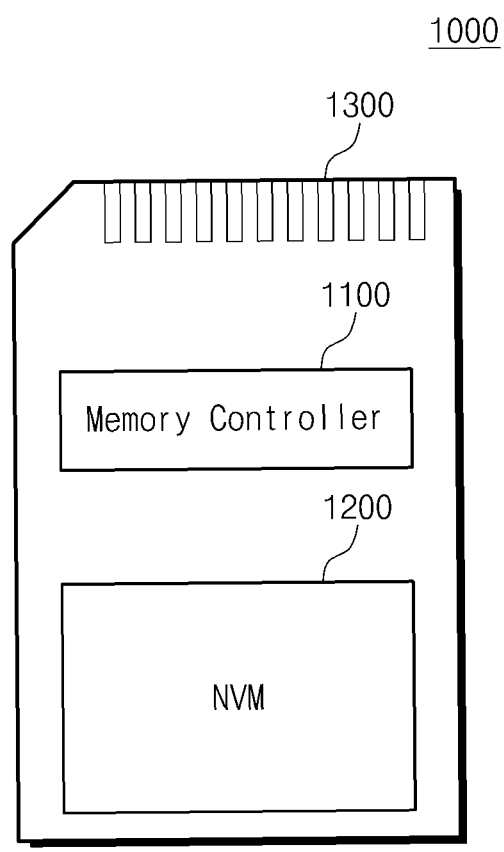
FIG. 16 is a block diagram schematically illustrating a memory card system including a nonvolatile memory system according to an exemplary embodiment.

FIG. 16 is a block diagram schematically illustrating a memory card system including a nonvolatile memory system according to exemplary embodiments of the inventive concept. Referring to FIG. 16, a memory card system 1000 may include a controller 1100, a nonvolatile memory 1200, and a connector 1300.

The controller 1100 may be connected to the nonvolatile memory 1200. The controller 1100 may be configured to access the nonvolatile memory 1200. For example, the controller 1100 may be adapted to control an overall operation of the nonvolatile memory 1200 including a read operation, a write operation, an erase operation, a background operation, and the like. The background operation may include operations: wear leveling, garbage collection, and the like.

The controller 1100 may provide an interface between the nonvolatile memory 1200 and a host. The controller 1100 may be configured to drive firmware for controlling the nonvolatile memory 1200. In exemplary embodiments, the controller 1100 may include components such as a RAM, a processing unit, a host interface, a memory interface, an error correction unit, and the like.

The controller 1100 may communicate with an external device through the connector 1300. The controller 1100 may communicate with an external device based on a particular communication protocol. For example, the controller 1100 may communicate with the external device through at least one of various interface protocols such as a universal serial bus (USB) protocol, a multimedia card (MMC) protocol, an embedded MMC (eMMC), a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, a universal flash storage (UFS) protocol, a nonvolatile memory express (NVMe) protocol, and the like.

The nonvolatile memory 1200 may be implemented with a variety of nonvolatile memory devices, such as an EPROM (Electrically Erasable and Programmable ROM), a NAND flash memory, a NOR flash memory, a PRAM (Phase-change RAM), an ReRAM (Resistive RAM), a FRAM (Ferroelectric RAM), an STT-MRAM (Spin-Torque Magnetic RAM), and so on.

In exemplary embodiments, the controller 1100 and the nonvolatile memory 1200 may be integrated in a single semiconductor device to constitute a solid state drive (SSD). The controller 1100 and the nonvolatile memory 1200 may be integrated in a single semiconductor device. For example, the controller 1100 and the nonvolatile memory 1200 may be integrated in a single semiconductor device to constitute a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), a universal flash storage (UFS), and the like.

The above-described nonvolatile memory 1200 may include an area which stores memory management information to which a program method of the inventive concept is applied. That is, the memory management information may be iteratively programmed at rows such that column locations thereof associated with the rows are different from each other. In addition, a specific command may be required to access the memory management information.

Figure 17:
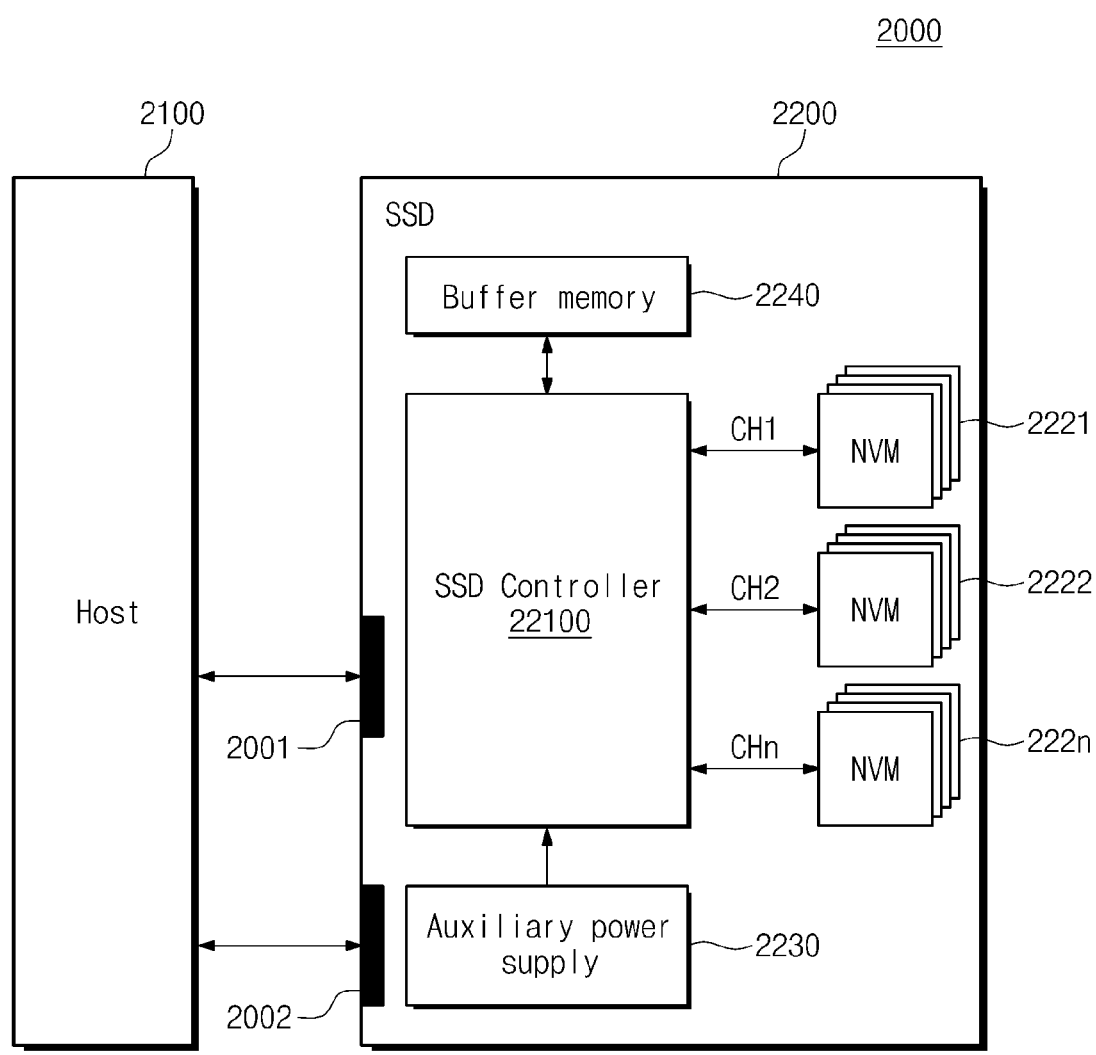
FIG. 17 is a block diagram illustrating a solid state drive including a nonvolatile memory system according to an exemplary embodiment.

FIG. 17 is a block diagram illustrating a solid state drive including a nonvolatile memory system according to an exemplary embodiment of the inventive concept. Referring to FIG. 17, a solid state drive (SSD) system 2000 may include a host 2100 and an SSD 2200. The SSD 2200 may exchange signals SGL with the host 2100 through the host interface 2001 and may be supplied with a power through a power connector 2002. The SSD 2200 may include a plurality of nonvolatile memories 2221 to 222n, an SSD controller 2210, an auxiliary power supply 2230, and a buffer memory 2240.

The SSD controller 2210 may control the nonvolatile memories 2221 to 222n in response to a signal SIG from the host 2100. The auxiliary power supply 2230 may be connected to the host 2100 through the power connector 2002. The auxiliary power supply 2230 may be charged by a power PWR from the host 2100. When a power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 may act as a buffer memory of the SSD 2200. For example, the buffer memory 2240 may temporarily store data received from the host 2100 or from the nonvolatile memory devices 2221 to 222n as flash memories, or it may temporarily store metadata (e.g., a mapping table) of the flash memories 2221 to 222n. The buffer memory 2240 may include volatile memories such as DRAM, SDRAM, DDR SDRAM, LPDDR SDRAM, SRAM, and so on or nonvolatile memories such as FRAM ReRAM, STT-MRAM, PRAM, and so on.

At least one of the flash memories 2221 to 222n may include an area which stores memory management information to which a program method of the inventive concept is applied. That is, the memory management information may be iteratively programmed at rows of a specific area of at least one of the flash memories 2221 to 222n such that column locations thereof associated with the rows are different from each other. In addition, a specific command may be required to access the memory management information.

Figure 18:
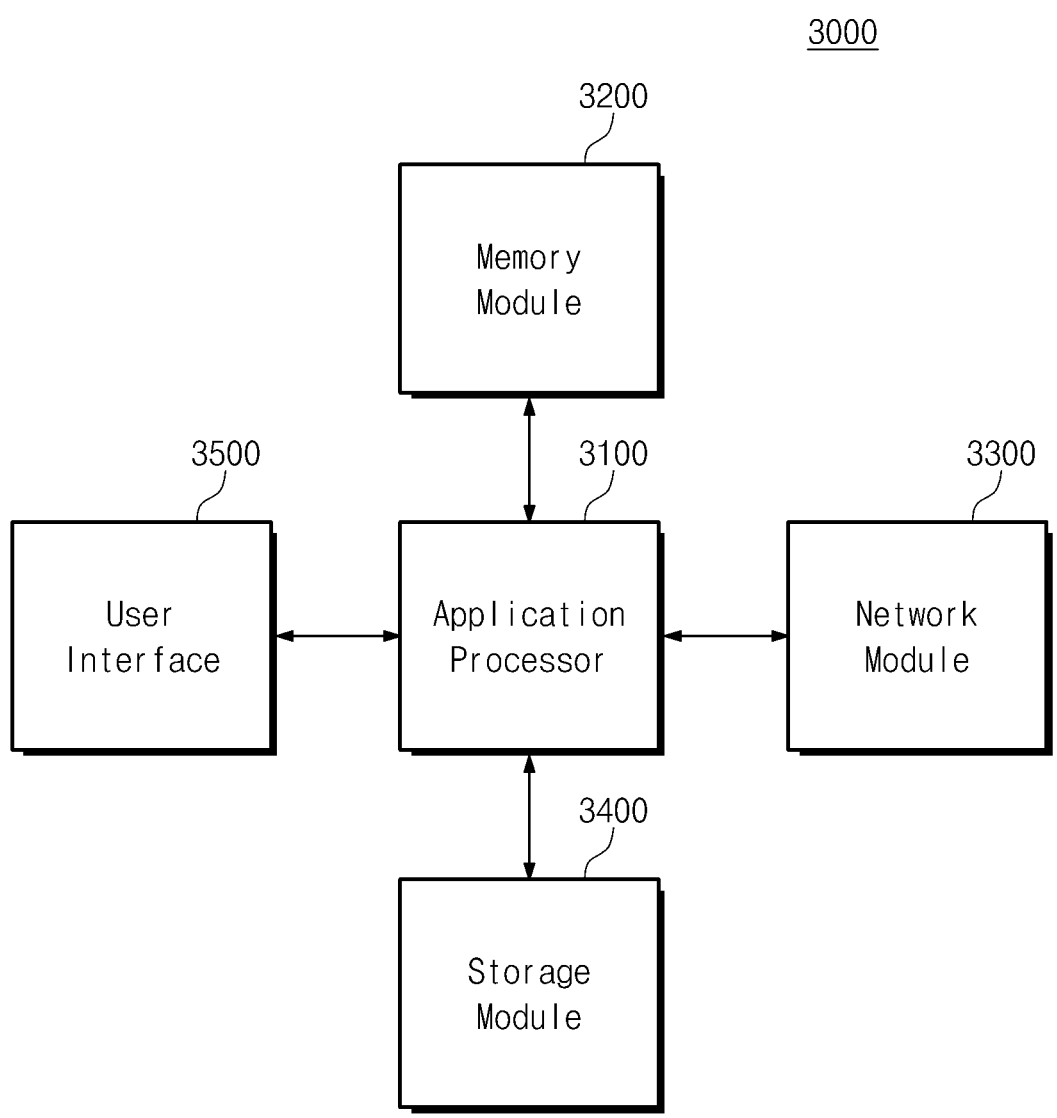
FIG. 18 is a block diagram schematically illustrating a user system including a nonvolatile memory system according to an exemplary embodiment.

FIG. 18 is a block diagram schematically illustrating a user system including a nonvolatile memory system according to an exemplary embodiment of the inventive concept. Referring to FIG. 18, a user system 3000 may include an application processor 3100, a memory module 3200, a network module 3300, a storage module 3400, and an input interface 3500.

The application processor 3100 may drive components of the user system 3000, an operating system, and the like. For example, the application processor 3100 may include controllers for controlling components of the user system 3000, graphics engines, a variety of interfaces, and the like. The application processor 3100 may be implemented with a system-on-chip (SoC).

The memory module 3200 may operate as a main memory, a working memory, a buffer memory, or a cache memory of the user system 3000. The memory module 3200 may be implemented with a volatile random access memory, such as DRAM, SDRAM, double date rate DRAM (DDR SDRAM), DDR2 SDRAM, DDR3 SDRAM, LPDDR DRAM, LPDDR2 DRAM, or LPDDR3 DRAM or a nonvolatile random access memory, such as PRAM, MRAM, RRAM, or FRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, WI-DI, and the like.

The storage module 3400 may store data. For example, the storage module 3400 may store data received from an external device. Alternatively, the storage module 3400 may provide the application processor 3100 with data stored therein. For example, the storage module 3400 may be implemented with a semiconductor memory device such as PRAM, MRAM, RRAM, NAND flash memory, NOR flash memory, or a three-dimensional NAND flash memory.

In exemplary embodiments, the storage module 3400 may be managed according to a manner described with reference to FIGS. 1 to 13D. The storage module 3400 may communicate with the application processor 3100 based on a predetermined interface. The storage module 3400 may adjust a garbage collection execution time based on a write command received from the application processor 3100.

At least one of memories constituting the storage module 3400 may include an area which stores memory management information to which a program method of the inventive concept is applied. That is, the memory management information may be iteratively programmed at rows of a specific area of at least one of storage areas of a memory such that column locations thereof associated with the rows are different from each other. In addition, a specific command may be required to access the memory management information.

The input interface 3500 may provide interfaces for providing data or commands to the application processor 3100 or for outputting data to an external device. For example, the input interface 3500 may include user input interfaces, such as a key board, a key pad, a button, a touch panel, a touch screen, a touch pad, a touch ball, a camera, a microphone, a Gyroscope, a vibration sensor, a piezoelectric element, and the like. The input interface 3500 may include user output interfaces, such as a liquid crystal display (LCD) device, an organic light emitting diode (OLED) display device, an active matrix OLED (AMOLED) display device, an LED, a speaker, a motor, and the like.

The memory card, the nonvolatile memory device, and the card controller according to an exemplary embodiment of the inventive concept may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

According to an exemplary embodiment of the inventive concept, even though an error or a defect exists at an area where bad block management information of a nonvolatile memory device is stored, it may be possible to provide the bad block management information without an error.

While the inventive concept has been described with reference to exemplary embodiments, it will be apparent to those skilled in the art that various changes and modifications may be made without departing from the spirit and scope of the inventive concept. Therefore, it should be understood that the above exemplary embodiments are not limiting, but illustrative.

What is claimed is:

1. A nonvolatile memory device comprising:
   a memory cell array comprising a first area, comprising a plurality of columns and rows which store bad block management information comprising a plurality of bits, and a second area which stores user data;
   a decoder configured to select at least one of the rows of the first area and the second area based on an address;
   a page buffer configured to store data in memory cells connected to the selected at least one row of the first area and the second area, or to detect data stored in the memory cells; and
   a control logic configured to control the decoder and the page buffer in response to a specific command, to access the first area,
   wherein a first bit among the plurality of bits is programmed into a first row and a first column, and a second bit among the plurality of bits, adjacent to the first bit, is programmed into the first row and a second column adjacent to the first column,
   wherein the first bit is programmed into a second row, adjacent to the first row, and the second column, and the second bit is programmed into the second row and a third column adjacent to the second column, and
   wherein the first bit is programmed into a third row, adjacent to the second row, and the third column, and the second bit is programmed into the third row and a fourth column adjacent to the third column.

2. The nonvolatile memory device of claim 1, wherein the control logic allows access to the first area in response to the specific command.

3. The nonvolatile memory device of claim 1, wherein the bad block management information comprises information associated with locations of bad blocks included in the memory cell array and a number of the bad blocks.

4. The nonvolatile memory device of claim 1, wherein the memory cell array is a three-dimensional memory cell array and each of memory cells constituting the three-dimensional memory cell array comprise a charge trap layer.

5. The nonvolatile memory device of claim 1, wherein the control logic is configured to rearrange the plurality of bits of the programmed bad block management information by shifting as many as a number of invalid bits before a start column.

6. The nonvolatile memory device of claim 5, wherein bits of each row of the programmed bad block management information are rearranged, and then, same bits may be located at same columns.

7. The nonvolatile memory device of claim 5, wherein bits of each row of the bad block management information are rearranged, and then, same bits are located at same columns.

8. A nonvolatile memory device comprising:
   a memory cell array comprising a first area, comprising a plurality of columns and rows which store bad block management information comprising a plurality of bits, and a second area which stores user data;
   a decoder configured to select at least one of the rows of the first area and the second area based on an address;
   a page buffer configured to store data in memory cells connected to the selected at least one row of the first area and the second area, or to detect data stored in the memory cells; and
   a control logic configured to control the decoder and the page buffer in response to a specific command, to access the first area,
   wherein a first bit among the plurality of bits is programmed into a first row and a first column, and a second bit among the plurality of bits is programmed into the first row and a second column adjacent to the first column,
   wherein the first bit is programmed into a second row, adjacent to the first row, and a third column adjacent to the second column by shifting bits of the bad block management information, and the second bit is programmed into a fourth column adjacent to the third column,
   wherein the first bit is programmed into a third row, adjacent to the second row, and the second column between the first and third columns.

9. The nonvolatile memory device of claim 8, wherein the control logic is configured to rearrange the plurality of bits of the programmed bad block management information by shifting as many as a number of invalid bits before a start column.

10. The nonvolatile memory device of claim 9, wherein bits or each row of the bad block management information are rearranged, and then, same bits are located at the same columns.

11. The nonvolatile memory device of claim 9, wherein the control logic is configured to detect and correct an error bit among the plurality bits of the shifted bad block management information by using a majority decision algorithm.

12. A nonvolatile memory device comprising:
   a memory cell array comprising a first area, comprising a plurality of columns and rows which store bad block management information comprising a plurality of bits, and a second area which stores user data;
   a decoder configured to select at least one of the rows of the first area and the second area based on an address;
   a page buffer configured to store data in memory cells connected to the selected at least one row of the first area and the second area or to detect data stored in the memory cells; and
   a control logic configured to control the decoder and the page buffer in response to a specific command, to access the first area,
   wherein a first bit among the plurality of bits is programmed into a first row and a first column, and a second bit among the plurality of bits, adjacent to the first bit, is programmed into the first row and a second column adjacent to the first column,
   wherein the first bit is programmed into a second row, adjacent to the first row, and the second column, and the second bit is programmed into the second row and a third column adjacent to the second column,
   wherein the first bit is programmed into a third row, adjacent to the second row, and the third column, and the second bit is programmed into the third row and a fourth column adjacent to the third column, wherein the control logic is configured to rearrange bits of respective rows of the programmed bad block management information by shifting as many as a number of invalid bits before a start column, and wherein the control logic is configured to detect and correct an error bit among the plurality bits of the shifted bad block management information by using a majority decision algorithm.

\* \* \* \* \*